(12) United States Patent
Gui et al.

(10) Patent No.: US 12,096,655 B2
(45) Date of Patent: Sep. 17, 2024

(54) DISPLAY SUBSTRATE, DISPLAY PANEL, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bingqiang Gui, Beijing (CN); Yang Yu, Beijing (CN); Peng Huang, Beijing (CN); Tao Gao, Beijing (CN); Wenqiang Li, Beijing (CN); Ke Liu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 496 days.

(21) Appl. No.: 17/310,405

(22) PCT Filed: Sep. 30, 2020

(86) PCT No.: PCT/CN2020/119472
§ 371 (c)(1),
(2) Date: Jul. 30, 2021

(87) PCT Pub. No.: WO2022/067698
PCT Pub. Date: Apr. 7, 2022

(65) Prior Publication Data
US 2022/0320212 A1    Oct. 6, 2022

(51) Int. Cl.
*H10K 59/121*    (2023.01)
*H10K 50/86*    (2023.01)
*H10K 59/12*    (2023.01)

(52) U.S. Cl.
CPC ....... *H10K 59/1213* (2023.02); *H10K 50/865* (2023.02); *H10K 59/1216* (2023.02); *H10K 59/1201* (2023.02)

(58) Field of Classification Search
CPC .......... H10K 59/1213; H10K 59/1216; H10K 2102/00; H10K 59/131; H01L 29/78633;
(Continued)

(56) References Cited

U.S. PATENT DOCUMENTS 9,905,627 B2    2/2018    Seol et al.
10,559,697 B2    2/2020    Oikawa et al.
(Continued)

FOREIGN PATENT DOCUMENTS

CN    104716091 A    6/2015
CN    105932032 A    9/2016
(Continued)

*Primary Examiner* — Mamadou L Diallo
(74) *Attorney, Agent, or Firm* — Kinney & Lange, P.A.

(57) ABSTRACT

A display substrate, a display panel, and a display device are provided. The display substrate includes: a base substrate; and a first transistor on the base substrate. The first transistor includes a first active layer, a first bottom gate electrode between the base substrate and the first active layer, and a first top gate electrode on a side of the first active layer away from the base substrate. A third gate insulating layer is provided between the first bottom gate electrode and the first active layer. The first active layer contains an oxide semiconductor material, and the third gate insulating layer contains a silicon oxide material. A surface of the first bottom gate electrode away from the base substrate is in direct contact with the silicon oxide material, and a surface of the first active layer close to the base substrate is in direct contact with the silicon oxide material.

19 Claims, 24 Drawing Sheets

(58) Field of Classification Search
CPC ................. H01L 27/1225; H01L 27/1255; H01L 29/423
See application file for complete search history.

(56) References Cited

U.S. PATENT DOCUMENTS

| | | | |
|---|---|---|---|
| 10,615,193 B2 | 4/2020 | Gui et al. | |
| 11,038,065 B2 | 6/2021 | Oikawa et al. | |
| 11,127,350 B2 | 9/2021 | Gai et al. | |
| 2014/0197382 A1* | 7/2014 | Kim | C22C 27/04 257/43 |
| 2015/0123084 A1 | 5/2015 | Kim et al. | |
| 2016/0365404 A1 | 12/2016 | Seol et al. | |
| 2018/0012913 A1 | 1/2018 | Lee et al. | |
| 2018/0197887 A1 | 7/2018 | Liu | |
| 2018/0331228 A1 | 11/2018 | Oikawa et al. | |
| 2019/0189720 A1* | 6/2019 | Lim | H10K 59/1216 |
| 2019/0348449 A1 | 11/2019 | Gui et al. | |
| 2020/0111914 A1 | 4/2020 | Oikawa et al. | |
| 2021/0098446 A1* | 4/2021 | He | H01L 27/1225 |
| 2021/0104558 A1* | 4/2021 | Kim | H01L 29/78675 |
| 2021/0201790 A1 | 7/2021 | Gai et al. | |
| 2021/0225978 A1 | 7/2021 | Lim et al. | |
| 2021/0288183 A1 | 9/2021 | Oikawa et al. | |
| 2021/0305284 A1* | 9/2021 | He | H01L 29/66757 |

FOREIGN PATENT DOCUMENTS

| | | |
|---|---|---|
| CN | 106876412 A | 6/2017 |
| CN | 108292684 A | 7/2018 |
| CN | 109273404 A | 1/2019 |
| CN | 109817645 A | 5/2019 |
| CN | 110034159 A | 7/2019 |
| CN | 110036435 A | 7/2019 |
| CN | 110299385 A | 10/2019 |
| CN | 111415948 A | 7/2020 |

* cited by examiner

DISPLAY SUBSTRATE, DISPLAY PANEL, AND DISPLAY DEVICE

CROSS-REFERENCE TO RELATED APPLICATION

This application is a Section 371 National Stage Application of International Application No. PCT/CN2020/119472, filed on Sep. 30, 2020, entitled "DISPLAY SUBSTRATE, DISPLAY PANEL AND DISPLAY DEVICE", which is incorporated herein by reference in its entirety.

TECHNICAL FIELD

The present disclosure relates to a field of display technology, and in particular to a display substrate, a display panel and a display device.

BACKGROUND

Organic light emitting diode (OLED) display device is a type of display device that displays information such as images by using a luminous OLED. OLED display device has characteristics such as low power consumption, high brightness and high response speed. Low Temperature Poly-Oxide TFT (LTPO TFT) technology is a new thin film transistor technology in recent years. In theory, LTPO TFT may save 5-15% of power compared to traditional Low Temperature Poly-Silicon TFT (LTPS TFT) technology, so that power consumption of the entire display screen is lower.

The above information disclosed in this section is only for the understanding of the background of the inventive concept of the present disclosure. Therefore, the above information may contain information that does not constitute the related art.

SUMMARY

In one aspect, there is provided a display substrate, including: a base substrate; and a first transistor arranged on the base substrate, wherein the first transistor includes a first active layer, a first bottom gate electrode located between the base substrate and the first active layer, and a first top gate electrode located on a side of the first active layer away from the base substrate, and any two of an orthographic projection of the active layer on the base substrate, an orthographic projection of the first bottom gate electrode on the base substrate and an orthographic projection of the first top gate electrode on the base substrate at least partially overlaps one another; a third gate insulating layer is provided between the first bottom gate electrode and the first active layer, the first active layer contains an oxide semiconductor material, the third gate insulating layer contains a silicon oxide material, a surface of the first bottom gate electrode away from the base substrate is in direct contact with the silicon oxide material, and a surface of the first active layer close to the base substrate is in direct contact with the silicon oxide material.

According to some exemplary embodiments, the display substrate further includes: a first semiconductor layer arranged on the base substrate; a second semiconductor layer arranged on a side of the first semiconductor layer away from the base substrate; and a third transistor, wherein the third transistor includes a third active layer and a third gate electrode, the third active layer is located in the first semiconductor layer and contains a polysilicon semiconductor material, and the first active layer is located in the second semiconductor layer.

According to some exemplary embodiments, a distance between the surface of the first active layer close to the base substrate and a surface of the first bottom gate electrode away from the base substrate is greater than that between a surface of the first active layer away from the base substrate and a surface of the first top gate electrode close to the base substrate.

According to some exemplary embodiments, the distance between the surface of the first active layer close to the base substrate and the surface of the first bottom gate electrode away from the base substrate is greater than a distance between a surface of the third active layer away from the base substrate and a surface of the third gate electrode close to the base substrate.

According to some exemplary embodiments, the distance between the surface of the first active layer away from the base substrate and the surface of the first top gate electrode close to the base substrate is substantially equal to the distance between the surface of the third active layer away from the base substrate and the surface of the third gate electrode close to the base substrate.

According to some exemplary embodiments, the display substrate further includes a second transistor; the second transistor includes a second bottom gate electrode located between the base substrate and an active layer of the second transistor, and a second top gate electrode located on a side of the active layer of the second transistor away from the base substrate; any two of an orthographic projection of the active layer of the second transistor on the base substrate, an orthographic projection of the second bottom gate electrode on the base substrate and an orthographic projection of the second top gate electrode on the base substrate at least partially overlaps one another.

According to some exemplary embodiments, the display substrate further includes a storage capacitor; the storage capacitor includes a first capacitor structure, a second capacitor structure and a third capacitor structure located on the base substrate; the third capacitor structure is located on a side of the first capacitor structure away from the base substrate, the second capacitor structure is located between the first capacitor structure and the third capacitor structure, and any two of an orthographic projection of the first capacitor structure on the base substrate, an orthographic projection of the second capacitor structure on the base substrate and an orthographic projection of the third capacitor structure on the base substrate at least partially overlaps one another; and the first capacitor structure and the third capacitor structure are electrically connected to each other so as to form a first capacitor electrode of the storage capacitor, and the second capacitor structure forms a second capacitor electrode of the storage capacitor.

According to some exemplary embodiments, the display substrate further includes a first conductive layer arranged on the base substrate, wherein the first conductive layer is located on a side of the first semiconductor layer away from the base substrate; and the first capacitor structure and the third gate electrode of the third transistor are located in the first conductive layer.

According to some exemplary embodiments, the display substrate further includes a second conductive layer arranged on the base substrate, wherein the second conductive layer is located between the first conductive layer and the second semiconductor layer; and the first bottom gate electrode and the second capacitor structure are located in the second conductive layer.

According to some exemplary embodiments, the display substrate further includes a third conductive layer arranged on the base substrate, wherein the third conductive layer is located on a side of the second semiconductor layer away from the base substrate; and the first top gate electrode and the third capacitor structure are located in the third conductive layer.

According to some exemplary embodiments, the display substrate further includes a first buffer layer located between the base substrate and the first semiconductor layer, wherein the first buffer layer contains silicon oxide or silicon nitride.

According to some exemplary embodiments, the display substrate further includes a first gate insulating layer located between the first semiconductor layer and the first conductive layer, wherein the first gate insulating layer contains silicon oxide.

According to some exemplary embodiments, the display substrate further includes a second gate insulating layer located between the first conductive layer and the second conductive layer, wherein the second gate insulating layer contains silicon nitride.

According to some exemplary embodiments, an insulating layer is provided between the first capacitor structure and the second capacitor structure, and the insulating layer includes a portion of the second gate insulating layer.

According to some exemplary embodiments, the display substrate further includes a third gate insulating layer located between the second conductive layer and the second semiconductor layer, wherein the third gate insulating layer contains silicon oxide.

According to some exemplary embodiments, the display substrate further includes a fourth gate insulating layer located between the second semiconductor layer and the third conductive layer, wherein the fourth gate insulating layer contains silicon oxide.

According to some exemplary embodiments, an insulating layer is provided between the second capacitor structure and the third capacitor structure, and the insulating layer includes a portion of the fourth gate insulating layer.

According to some exemplary embodiments, two insulating layers are provided between the second capacitor structure and the third capacitor structure, and the two insulating layers include a portion of the third gate insulating layer and a portion of the fourth gate insulating layer.

According to some exemplary embodiments, the display substrate further includes a second buffer layer located between the second gate insulating layer and the second conductive layer; and two insulating layers are provided between the first capacitor structure and the second capacitor structure, and the two insulating layers include a portion of the second gate insulating layer and a portion of the second buffer layer.

According to some exemplary embodiments, the third capacitor structure is located in the second semiconductor layer, and the third capacitor structure includes a structure formed of a conductized oxide semiconductor material.

According to some exemplary embodiments, the display substrate further includes a third gate insulating layer located between the second conductive layer and the second semiconductor layer, and the third gate insulating layer contains silicon oxide; and only one insulating layer is provided between the second capacitor structure and the third capacitor structure, and the insulating layer includes a portion of the third gate insulating layer.

According to some exemplary embodiments, the display substrate further includes a fourth conductive layer located on a side of the third conductive layer away from the base substrate; each of the plurality of thin film transistors includes a source electrode and a drain electrode, and the source electrode and the drain electrode of each thin film transistor are located in the fourth conductive layer.

According to some exemplary embodiments, the display substrate further includes a fifth conductive layer located on a side of the fourth conductive layer away from the base substrate; and the fifth conductive layer includes a light-shielding layer, and an orthographic projection of the light-shielding layer on the base substrate at least covers each of the orthographic projection of the active layer of the first transistor on the base substrate and the orthographic projection of active layer of the second transistor on the base substrate.

According to some exemplary embodiments, the fourth conductive layer includes a first conductive sub-layer arranged on the interlayer insulating layer and a second conductive sub-layer arranged on a side of the first conductive sub-layer away from the base substrate, and the first conductive sub-layer and the second conductive sub-layer are in contact with each other.

In another aspect, there is provided a display panel, including the display substrate described above.

In yet another aspect, there is provided a display device, including the display substrate described above or the display panel described above.

In yet another aspect, there is provided a method of manufacturing a display substrate, including: providing a base substrate; preparing a first semiconductor layer on the base substrate by using a patterning process, wherein the first semiconductor layer contains a polysilicon semiconductor island; forming a first conductive layer on a side of the first semiconductor layer away from the base substrate by using a patterning process; forming a second conductive layer on a side of the first conductive layer away from the base substrate by using a patterning process; forming a gate insulating layer on a side of the second conductive layer away from the base substrate; and forming a second semiconductor layer on a side of the second conductive layer away from the base substrate by using a patterning process, wherein the second semiconductor layer contains an oxide semiconductor island, wherein the display substrate includes a plurality of thin film transistors arranged on the base substrate, the plurality of thin film transistors at least include a first transistor, a second transistor and a third transistor; wherein each of the plurality of thin film transistors includes an active layer, the active layer of the third transistor is located in the first semiconductor layer, at least one of the active layer of the first transistor and the active layer of the second transistor is located in the second semiconductor layer; and wherein the first transistor includes a first active layer, a first bottom gate electrode located between the base substrate and the first active layer, and a first top gate electrode located on a side of the first active layer away from the base substrate, and any two of an orthographic projection of the first active layer on the base substrate, an orthographic projection of the first bottom gate electrode on the base substrate and an orthographic projection of the first top gate electrode on the base substrate at least partially overlaps one another; a third gate insulating layer is provided between the first bottom gate electrode and the first active layer, the first active layer contains the oxide semiconductor island, the third gate insulating layer contains a silicon oxide material, a surface of the first bottom gate electrode away from the base substrate is in direct contact with the silicon oxide material, and a surface of the first active layer close to the base substrate is in direct contact with the silicon oxide material.

According to some exemplary embodiments, the method further includes: forming an interlayer insulating layer on a side of the first top gate electrode away from the base substrate; forming a plurality of first via holes in the interlayer insulating layer, wherein the plurality of first via holes expose at least a portion of the active layer of the first transistor and at least a portion of the active layer of the second transistor; depositing a first conductive material layer on a side of the interlayer insulating layer away from the base substrate; forming a plurality of second via holes, wherein the plurality of second via holes expose at least a portion of the active layer of the third transistor; depositing a second conductive layer on a side of the first conductive material layer away from the base substrate; and patterning the first conductive material layer and the second conductive material layer by using one patterning process, so as to form source electrodes and drain electrodes of the plurality of thin film transistors.

BRIEF DESCRIPTION OF THE DRAWINGS

By describing in detail exemplary embodiments of the present disclosure with reference to the drawings, the features and advantages of the present disclosure will become more apparent.

DETAILED DESCRIPTION OF EMBODIMENTS

Figure 1:
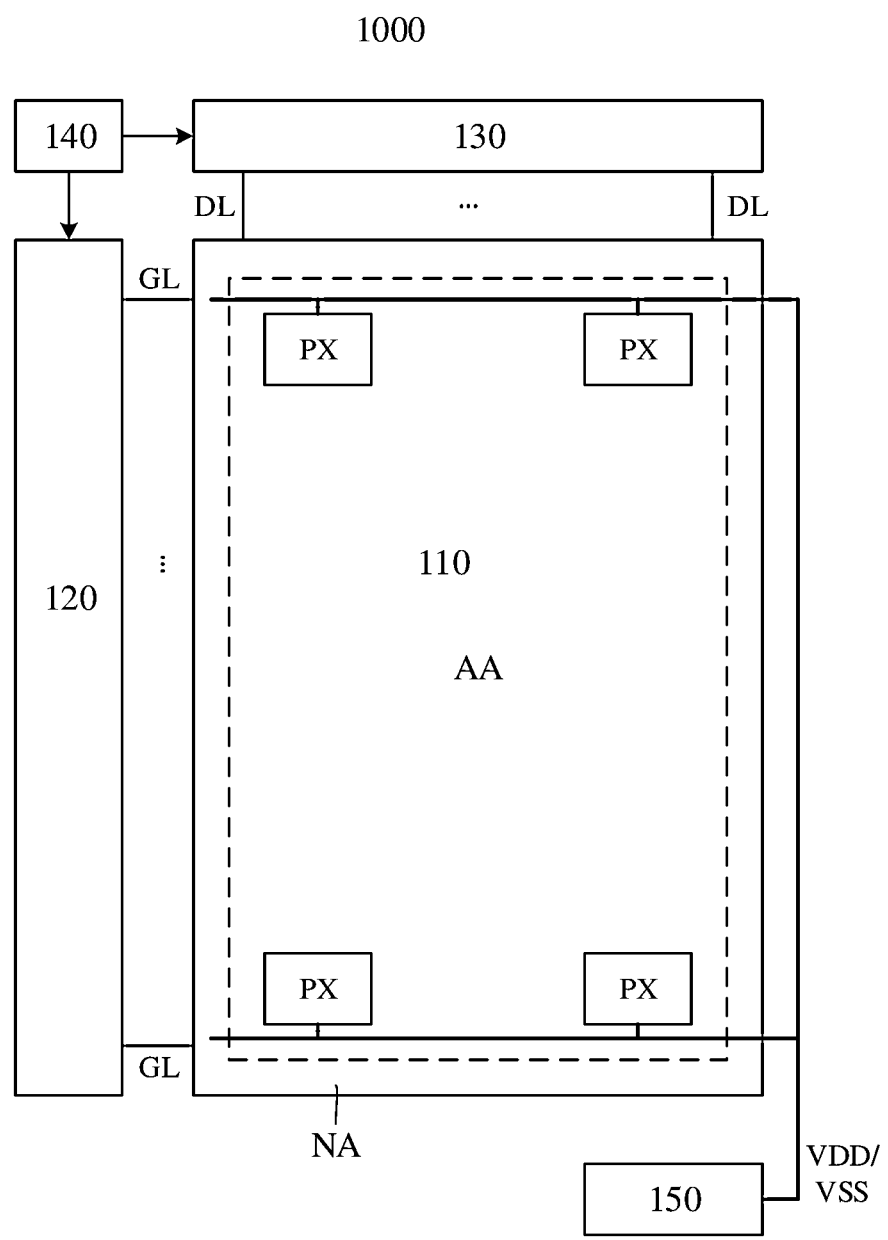
FIG. 1 shows a schematic plan view of a display device according to some embodiments of the present disclosure.

In order to make the objectives, technical solutions and advantages of the present disclosure more clear, the technical solutions of the embodiments of the present disclosure are clearly and completely described below with reference to the drawings. Obviously, the described embodiments are only a part but not all of the embodiments of the present disclosure. Based on the embodiments of the present disclosure, all other embodiments obtained by those ordinary skilled in the art without carrying out inventive effort fall within the protection scope of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is present. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X axis, Y axis and Z axis are not limited to three axes of a rectangular coordinate system, and may be interpreted in a broader meaning. For example, the X axis, the Y axis and the Z axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

In the present disclosure, unless otherwise specified, the terms "substantially", "basically", "about", "approximately" and other similar terms are used as terms of approximation rather than as terms of degree, and they are intended to explain the inherent deviation of the measured or calculated value that will be recognized by those ordinary skilled in the art. Taking into account actual process errors, measurement problems, and errors related to measurement of specific quantities (that is, limitations of a measurement system), the terms "substantially", "basically", "about" or "approximately" used in the present disclosure includes the stated value and means that the specific value determined by those ordinary skilled in the art is within an acceptable range of deviation. For example, "substantially", "basically", "about" or "approximately" may mean within one or more standard deviations, or within ±30%, ±20%, ±10% or ±5% of the stated value.

It should be noted that the expression "same layer" refers to a layer structure formed by first using the same film forming process to form a film layer for forming a specific pattern, and then using the same mask to pattern the film layer by using one patterning process. Depending on the specific patterns, the one-time patterning process may include multiple exposure, development or etching processes, and the specific pattern in the layer structure formed may be continuous or discontinuous. That is to say, a plurality of elements, components, structures and/or parts located in the "same layer" are made of the same material and formed by the same patterning process. Generally, a plurality of elements, components, structures and/or parts located in the "same layer" have roughly the same thickness.

Those skilled in the art should understand that in the present disclosure, unless otherwise specified, the expression "height" or "thickness" refers to a size in a direction perpendicular to a surface of each film layer arranged in the display substrate, that is, a size in the light emitting direction of the display substrate, or called a size in a normal direction of the display device.

The embodiments of the present disclosure provide at least a display substrate. The display substrate includes: a base substrate; a first semiconductor layer arranged on the base substrate; a second semiconductor layer arranged on a side of the first semiconductor layer away from the base substrate. The display substrate further includes a plurality of thin film transistors arranged on the base substrate. The plurality of thin film transistors at least include a first transistor, a second transistor and a third transistor, and each of the plurality of thin film transistors includes an active layer. At least one of the active layer of the first transistor and the active layer of the second transistor is located in the second semiconductor layer and contains an oxide semiconductor material. The active layer of the third transistor is located in the first semiconductor layer and contains a polysilicon semiconductor material. At least one of the first transistor and the second transistor has a dual-gate structure. In the embodiments of the present disclosure, at least one of the active layer of the first transistor and the active layer of the second transistor is formed of an oxide semiconductor material such as LTPO, and has a dual-gate structure, so that the display performance of the display panel may be improved.

FIG. 1 shows a schematic plan view of a display device according to some embodiments of the present disclosure. For example, the display device may be an OLED display device. Referring to FIG. 1, a display device 1000 may include a display panel 110, a gate driver 120, a data driver 130, a controller 140, and a voltage generator 150. For example, the display device 1000 may be an OLED display device. The display panel 110 may include an array substrate 100 and a plurality of pixels PX. The array substrate 100 may include a display area AA and a non-display area NA, and the plurality of pixels PX are arranged in an array in the display area AA. A signal generated by the gate driver 120 may be applied to the pixel PX through a signal line such as a scan signal line GL, and a signal generated by the data driver 130 may be applied to the pixel PX through a signal line such as a data line DL. A first voltage such as VDD and a second voltage such as VSS may be applied to the pixel PX. The first voltage such as VDD may be higher than the second voltage such as VSS. Optionally, the first voltage such as VDD may be applied to an anode of a light emitting device (for example, OLED), and the second voltage such as VSS may be applied to a cathode of the light emitting device, so that the light emitting device may emit light.

For example, each pixel PX may include a plurality of sub-pixels, such as a red sub-pixel, a green sub-pixel and a blue sub-pixel, or may include a white sub-pixel, a red sub-pixel, a green sub-pixel and a blue sub-pixel.

Figure 2:
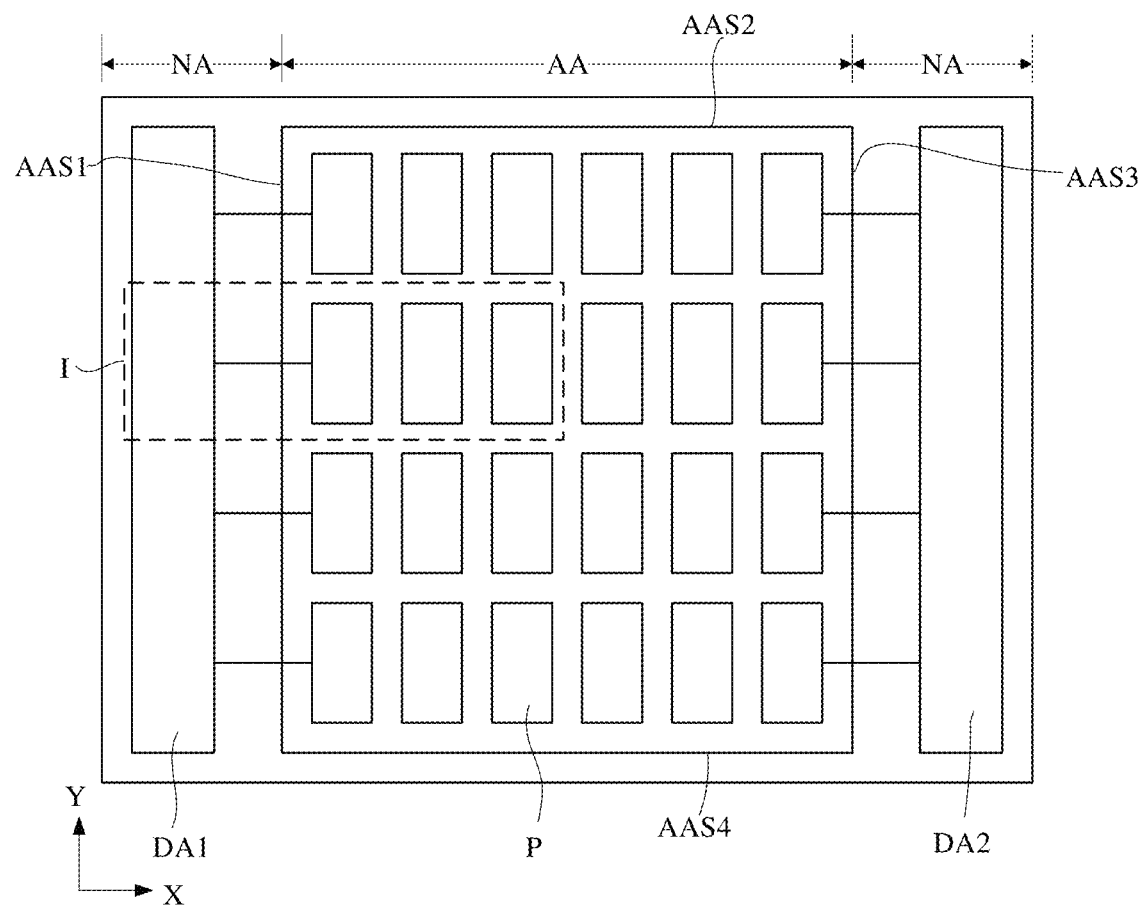
FIG. 2 shows a schematic plan view of a display substrate of a display device according to some embodiments of the present disclosure.

FIG. 2 shows a schematic plan view of a display substrate of a display device according to some embodiments of the present disclosure. For example, the display substrate may be an array substrate for an OLED display panel. Referring to FIG. 2, the display substrate may include a display area AA and a non-display area NA. For example, the display area AA and the non-display area NA may have a plurality of boundaries, such as AAS1, AAS2, AAS3 and AAS4 as shown in FIG. 2. The display substrate may further include a driver located in the non-display area NA. For example, the driver may be located on at least one side of the display area AA. In the embodiments shown in FIG. 2, the driving circuits are respectively located on left and right sides of the display area AA. It should be noted that the left and right sides may be left and right sides of the display substrate (screen) viewed by human eyes during display. The driver may be used to drive each pixel in the display substrate for display. For example, the driver may include the gate driver 120 and the data driver 130 described above. The data driver 130 is used to sequentially latch input data according to a timing of a clock signal and convert the latched data into an analog signal and then input the analog signal to each data line of the display substrate. The gate driver 120 is usually implemented by a shift register that converts the clock signal into an on/off voltage and outputs to each scan signal line of the display substrate.

It should be noted that although FIG. 2 shows that the drivers are located on the left and right sides of the display area AA, the embodiments of the present disclosure are not limited thereto. The drive circuit may be located at any suitable position in the non-display area NA.

For example, a GOA (Gate Driver on Array) technology may be adopted for the driver. In the GOA technology, a gate driving circuit instead of an external driving chip is directly arranged on the array substrate. Each GOA unit acts as a stage of shift register, and each stage of shift register is connected to a gate line. The each stage of shift register outputs a turn-on voltage in turn, so that a progressive scanning of pixels is realized. In some embodiments, each stage of shift register may also be connected to a plurality of gate lines. This may adapt to a development trend of high resolution and narrow frame of the display substrate.

Referring to FIG. 2, a left GOA circuit DA1, a plurality of pixels P located in the display area AA, and a right GOA circuit DA2 are provided on the display substrate. The left GOA circuit DA1 and the right GOA circuit DA2 are electrically connected to a display IC through respective signal lines, and a supply of GOA signals is controlled by the display IC. The display IC is, for example, arranged at a lower side of the display substrate (in a direction of human eyes). The left GOA circuit DA1 and the right GOA circuit DA2 are further electrically connected to each pixel through respective signal lines (for example, scan signal lines GL) to supply driving signals to each pixel.

Figure 3:
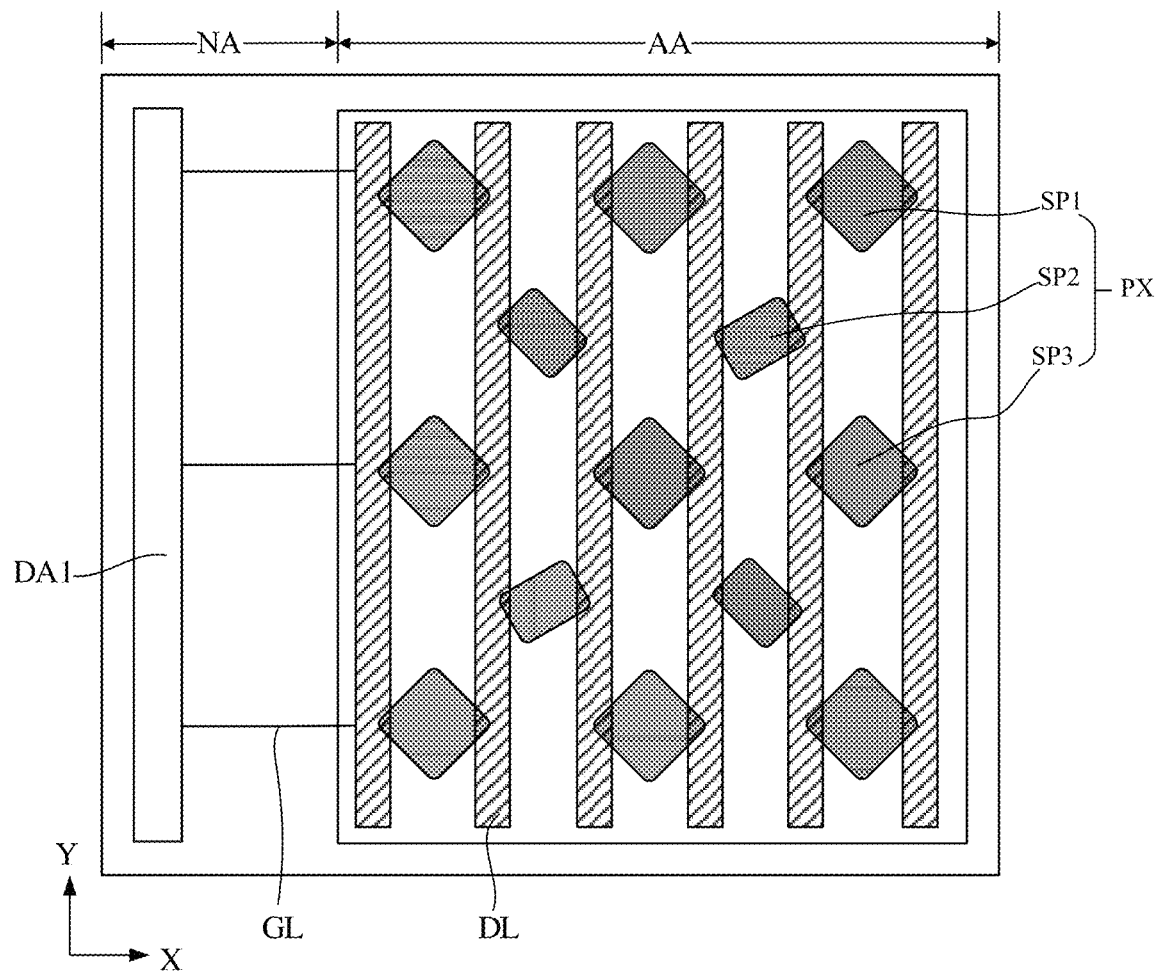
FIG. 3 shows a partial enlarged view of a display substrate at part I of FIG. 2 according to some embodiments of the present disclosure.

FIG. 3 shows a partial enlarged view of a display substrate at part I of FIG. 2 according to some embodiments of the present disclosure. It should be noted that it is exemplarily shown that an orthographic projection of the sub-pixel on the base substrate is a rounded rectangle. However, the embodiments of the present disclosure are not limited thereto. For example, the orthographic projection of the sub-pixel on the base substrate may have other shapes, such as a rectangle, a hexagon, a pentagon, a square, or a circle. Moreover, an arrangement of three sub-pixels in a pixel unit is not limited to that shown in FIG. 3.

Referring to FIG. 1, FIG. 2 and FIG. 3 in combination, each pixel unit PX may include a plurality of sub-pixels, for example, a first sub-pixel SP1, a second sub-pixel SP2, and a third sub-pixel SP3. For ease of understanding, the first sub-pixel SP1, the second sub-pixel SP2 and the third sub-pixel SP3 may be described as a red sub-pixel, a green sub-pixel and a blue sub-pixel, respectively. However, the embodiments of the present disclosure are not limited thereto.

The plurality of sub-pixels are arranged on the base substrate 1 in an array in a row direction X and a column direction Y. It should be noted that although in the illustrated embodiments, the row direction X and the column direction Y are perpendicular to each other, the embodiments of the present disclosure are not limited thereto.

It should be understood that, in the embodiments of the present disclosure, each sub-pixel includes a pixel driving circuit and a light emitting device. For example, the light emitting device may be an OLED light emitting device, including an anode, an organic light emitting layer and a cathode that are stacked. The pixel driving circuit may include a plurality of thin film transistors and at least one storage capacitor.

Hereinafter, a 7T1C pixel driving circuit is illustrated by way of example in describing a structure of the pixel driving circuit in detail. However, the embodiments of the present disclosure are not limited to the 7T1C pixel driving circuit. In a case of no conflict, any other known pixel driving circuit structures may be applied to the embodiments of the present disclosure.

Figure 4:
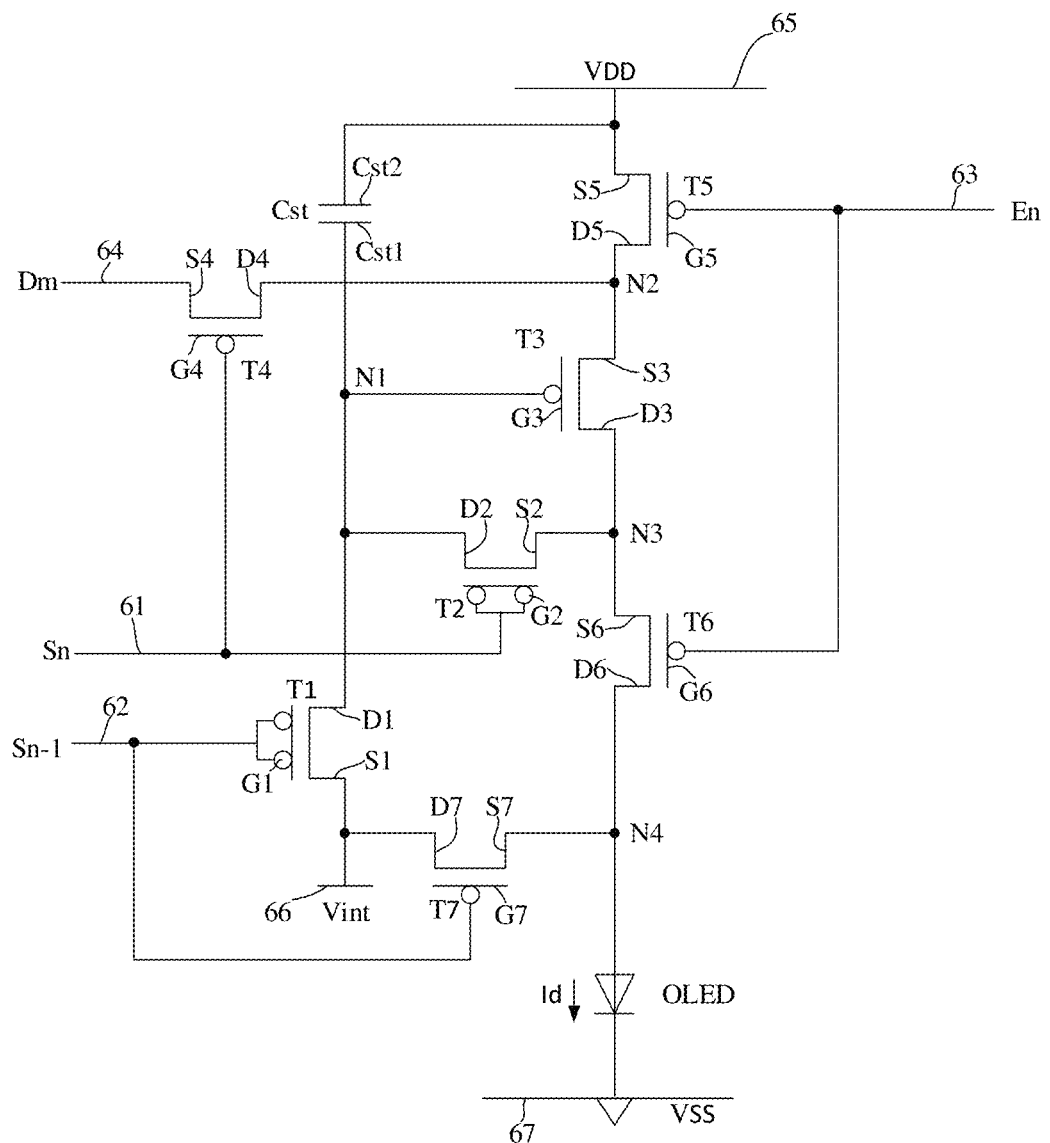
FIG. 4 shows an equivalent circuit diagram of a pixel driving circuit of a display substrate according to some exemplary embodiments of the present disclosure.

FIG. 4 shows an equivalent circuit diagram of a pixel driving circuit of a display substrate according to some exemplary embodiments of the present disclosure. As shown in FIG. 4, the pixel driving circuit may include a plurality of thin film transistors and a storage capacitor Cst. The pixel driving circuit is used to drive the organic light emitting diode (that is, OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate electrode, a source electrode, and a drain electrode.

The display substrate may further include a plurality of signal lines. For example, the plurality of signal lines include: a scan signal line 61 for transmitting a scan signal Sn, a reset signal line 62 for transmitting a reset control signal RESET (that is, a scan signal of a previous line), a light emission control line 63 for transmitting a light emission control signal En, a data line 64 for transmitting a data signal Dm, a driving voltage line 65 for transmitting a driving voltage VDD, an initialization voltage signal 66 for transmitting an initialization voltage Vint, and a power line 67 for transmitting a VSS voltage.

The first transistor T1 has a gate electrode G1 electrically connected to the reset signal line 62, a source electrode S1 electrically connected to the initialization voltage line 66, and a drain electrode D1 electrically connected to one end Cst1 of the storage capacitor Cst1, a drain electrode D2 of the second transistor T2 and a gate electrode G3 of the third transistor T3. As shown in FIG. 4, the drain electrode of the first transistor T1 D1, the end Cst1 of the storage capacitor Cst1, the drain electrode D2 of the second transistor T2 and the gate electrode G3 of the third transistor T3 are electrically connected at a node N1. The first transistor T1 is turned on according to the reset control signal RESET transmitted through the reset signal line 62 so as to transmit the initialization voltage Vint to the gate electrode G1 of the third transistor T3, so that an initialization operation is performed to initialize the voltage of the gate electrode G3 of the third transistor T3. That is, the first transistor T1 is also referred to an initialization transistor.

The second transistor T2 has a gate electrode G2 electrically connected to the scan signal line 61, a source electrode S2 electrically connected to anode N3, and the drain electrode D2 electrically connected to the node N1. The second transistor T2 is turned on according to the scan signal Sn transmitted through the scan signal line 61 so as to electrically connect the gate electrode G3 and the drain electrode D3 of the third transistor T3, so that a diode connection of the third transistor T3 is achieved.

The third transistor T3 has the gate electrode G3 electrically connected to the node N1, a source electrode S3 electrically connected to a node N2, and the drain electrode D3 electrically connected to the node N3. The third transistor T3 receives the data signal Dm according to a switching operation of the fourth transistor T4 so as to supply a driving current Id to the OLED. That is, the third transistor T3 is also referred to as a driving transistor.

The fourth transistor T4 has a gate electrode G4 electrically connected to the scan signal line 61, a source electrode S4 electrically connected to the data line 64, and a drain electrode D4 electrically connected to the node N2 (that is, to the source electrode S3 of the third transistor T3). The fourth transistor T4 is turned on according to the scan signal Sn transmitted through the scan signal line 61, so that a switching operation is performed to transmit the data signal Dm to the source electrode S3 of the third transistor T3.

The fifth transistor T5 has a gate electrode G5 electrically connected to the light emission control line 63, a source electrode S5 electrically connected to the driving voltage line 65, and a drain electrode D5 electrically connected to the node N2.

The sixth transistor T6 has a gate electrode G6 electrically connected to the light emission control line 63, a source electrode S6 electrically connected to the node N3, and a drain electrode D6 electrically connected to a node N4 (that is, to the anode of the OLED). The fifth transistor T5 and the sixth transistor T6 are turned on concurrently (for example, simultaneously) according to the light emission control signal En transmitted through the light emission control line 63 so as to transmit the driving voltage VDD to the OLED, thereby allowing the driving current Id to flow into the OLED.

The seventh transistor T7 has a gate electrode G7 electrically connected to the reset signal line 62, a source electrode S7 electrically connected to the node N4, and a drain electrode electrically connected to the initialization voltage line 66.

The storage capacitor Cst has one end (hereinafter referred to as a first capacitor electrode) Cst1 electrically connected to the node N1, and the other end (hereinafter referred to as a second capacitor electrode) Cst2 electrically connected to the driving voltage line 65.

The OLED has an anode electrically connected to the node N4, and a cathode electrically connected to the power line 67 to receive the common voltage VSS. Accordingly, the OLED receives the driving current Id from the third transistor T3 to emit light, so as to display images.

It should be noted that in FIG. 4, each of the thin film transistors T1, T2, T3, T4, T5, T6 and T7 is a p-channel field effect transistor. However, the embodiments of the present disclosure are not limited thereto. At least some of the thin film transistors T1, T2, T3, T4, T5, T6 and T7 may be n-channel field effect transistors.

In operation, in an initialization stage, the reset control signal RESET having a low level is supplied through the reset signal line 62. Subsequently, the first transistor T1 is turned on based on the low level of the reset control signal RESET, and the initialization voltage Vint from the initialization voltage line 66 is transmitted to the gate electrode G1 of the third transistor T3 through the first transistor T1. Therefore, the third transistor T3 is initialized due to the initialization voltage Vint.

In a data programming stage, the scan signal Sn having a low level is supplied through the scan signal line 61. Subsequently, the fourth transistor T4 and the second transistor T2 are turned on based on the low level of the scan signal Sn. Therefore, the third transistor T3 is placed in a diode-connected state by the second transistor T2 turned-on and is biased in a forward direction.

Subsequently, a compensation voltage Dm+Vth (for example, Vth is a negative value) obtained by subtracting the threshold voltage Vth of the third transistor T3 from the data signal Dm supplied via the data line 64 is applied to the gate electrode G3 of the third transistor T3. Next, the driving voltage VDD and the compensation voltage Dm+Vth are applied to both terminals of the storage capacitor Cst, so that an electric charge corresponding to a voltage difference between the terminals is stored in the storage capacitor Cst.

In a light emission stage, the light emission control signal En from the light emission control line 63 changes from a high level to a low level. Subsequently, in the light emission stage, the fifth transistor T5 and the sixth transistor T6 are turned on based on the low level of the light emission control signal En.

Next, a driving current is generated based on a difference between the voltage of the gate electrode G3 of the third transistor T3 and the driving voltage VDD. The driving current Id corresponding to the difference between the driving current and a bypass current is supplied to the OLED through the sixth transistor T6.

In the light emission stage, based on a current-voltage relationship of the third transistor T3, a gate-source voltage of the third transistor T3 is maintained at (Dm+Vth)-VDD due to the storage capacitor Cst. The driving current Id is proportional to $(Dm-VDD)^2$. Therefore, the driving current Id may not be affected by a variation of the threshold voltage Vth of the third transistor T3.

Figure 5:
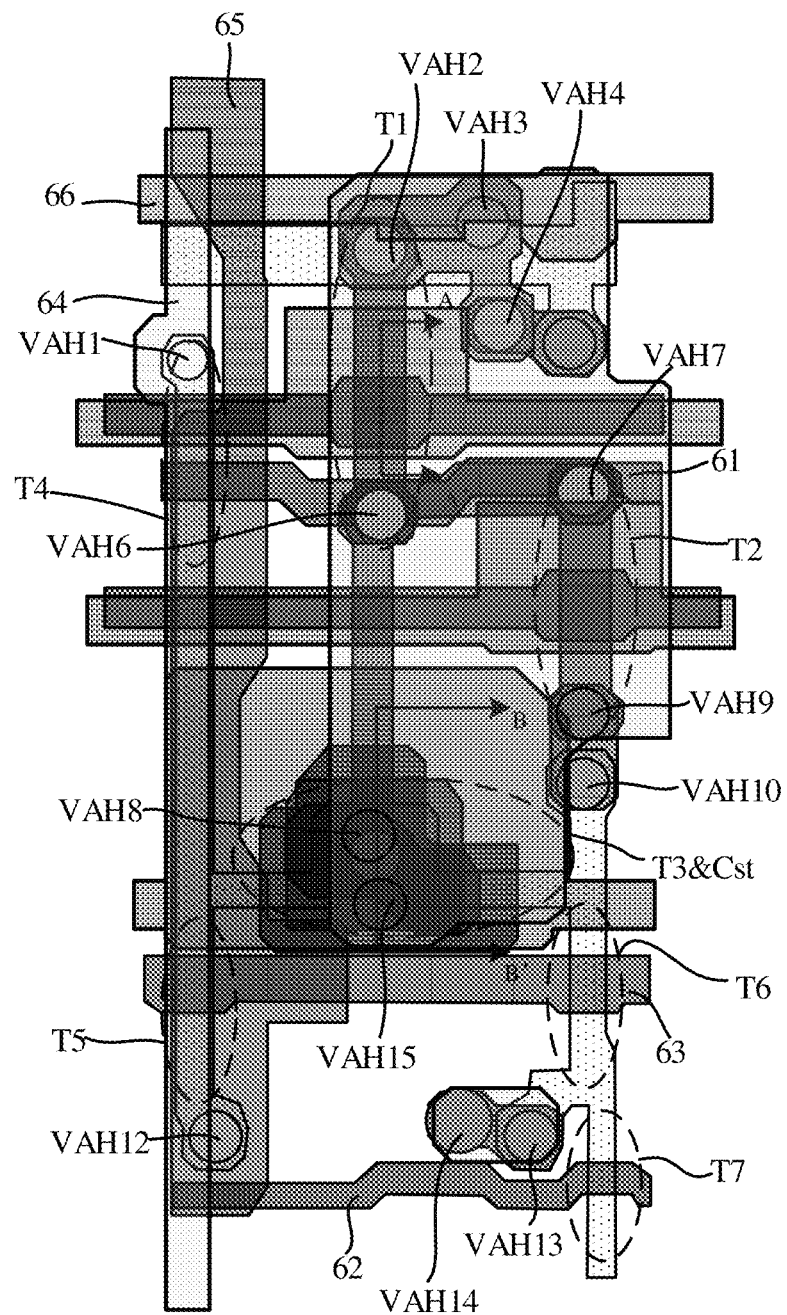
FIG. 5 shows a schematic diagram of a planar structure of a pixel driving circuit of a sub-pixel of a display substrate according to some exemplary embodiments of the present disclosure.
Figure 6:
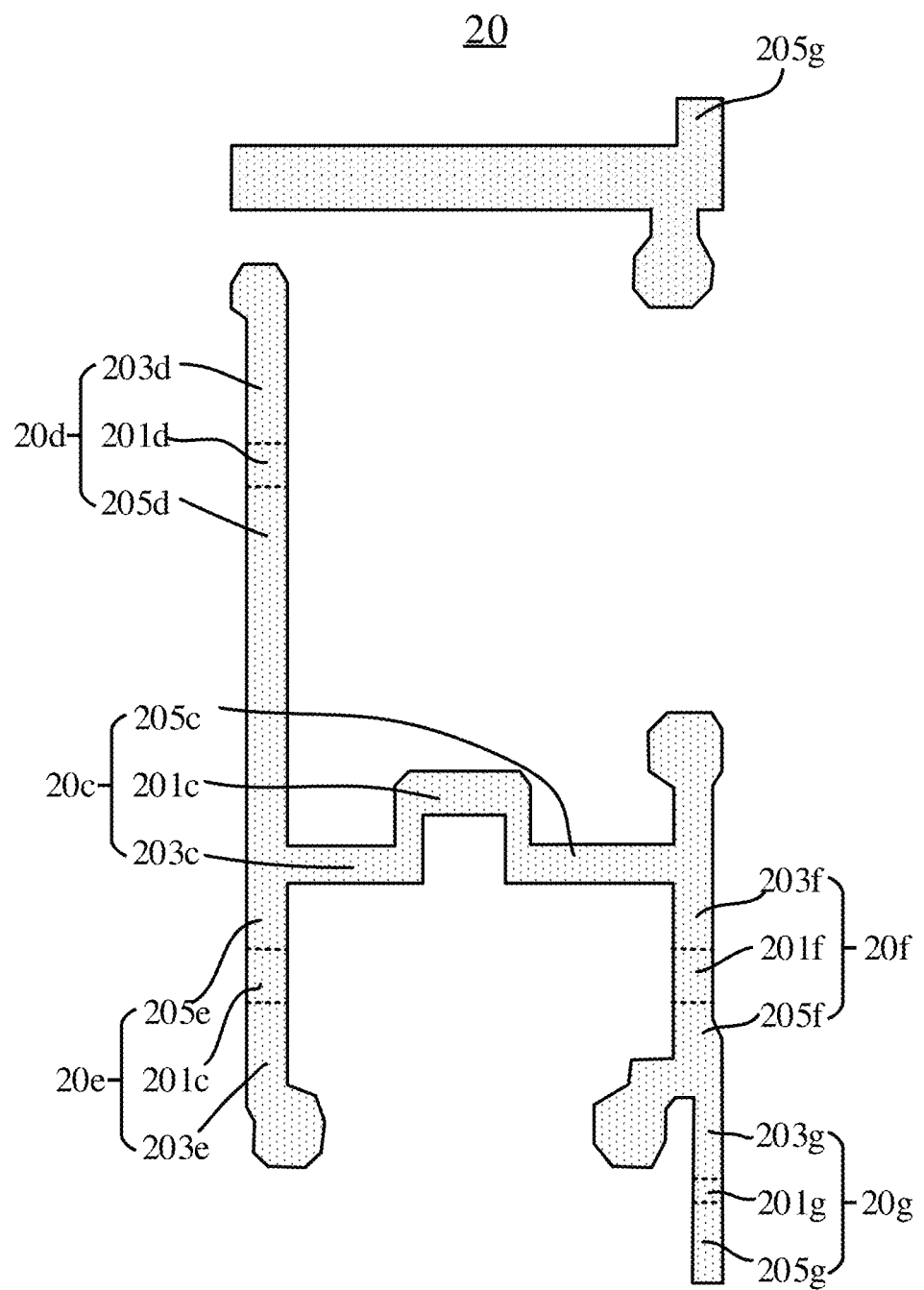
FIG. 6 shows a schematic diagram of a planar structure of a first semiconductor layer of the pixel driving circuit shown in FIG. 5.
Figure 7:
FIG. 7 shows a schematic diagram of a planar structure of a first conductive layer of the pixel driving circuit shown in FIG. 5.
Figure 7:
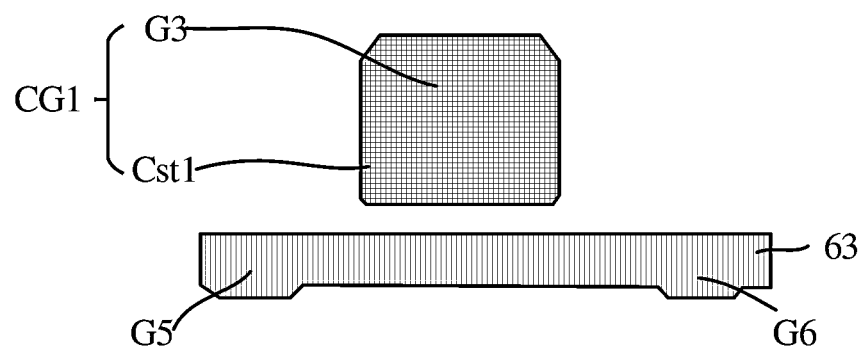
Figure 7:
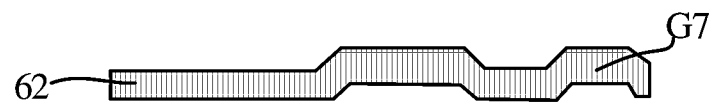
Figure 8:
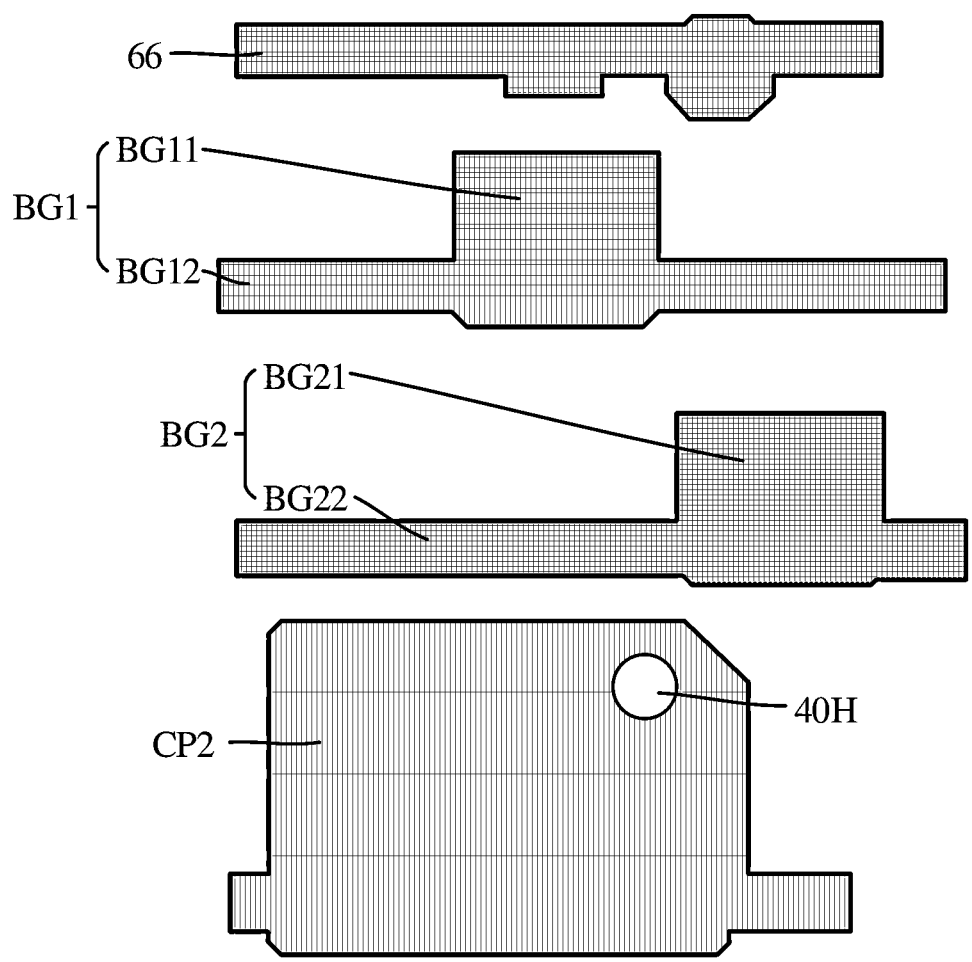
FIG. 8 shows a schematic diagram of a planar structure of a second conductive layer of the pixel driving circuit shown in FIG. 5.
Figure 9:
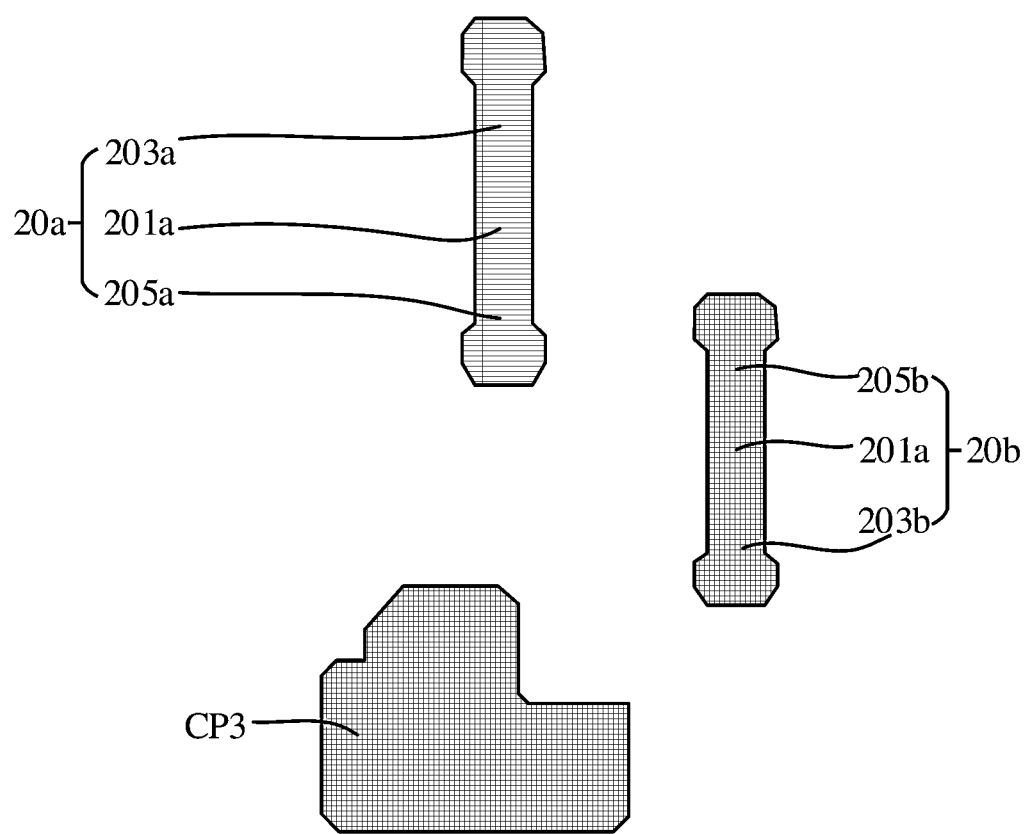
FIG. 9 shows a schematic diagram of a planar structure of a second semiconductor layer of the pixel driving circuit shown in FIG. 5.
Figure 10:
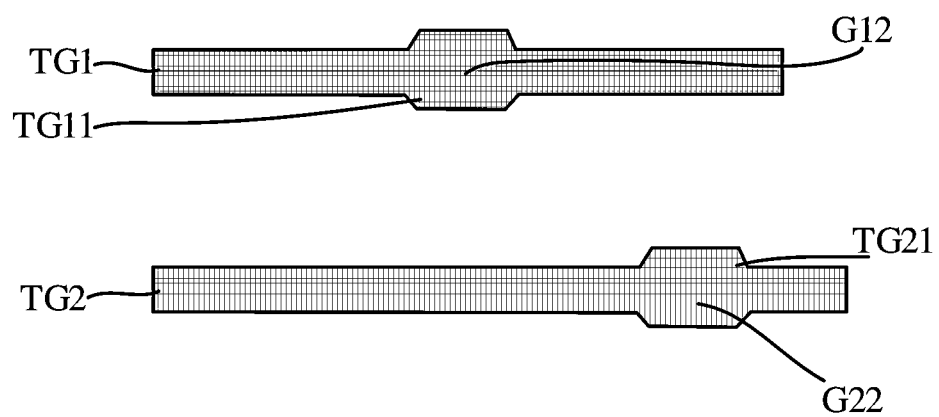
FIG. 10 shows a schematic diagram of a planar structure of a third conductive layer of the pixel driving circuit shown in FIG. 5.
Figure 11:
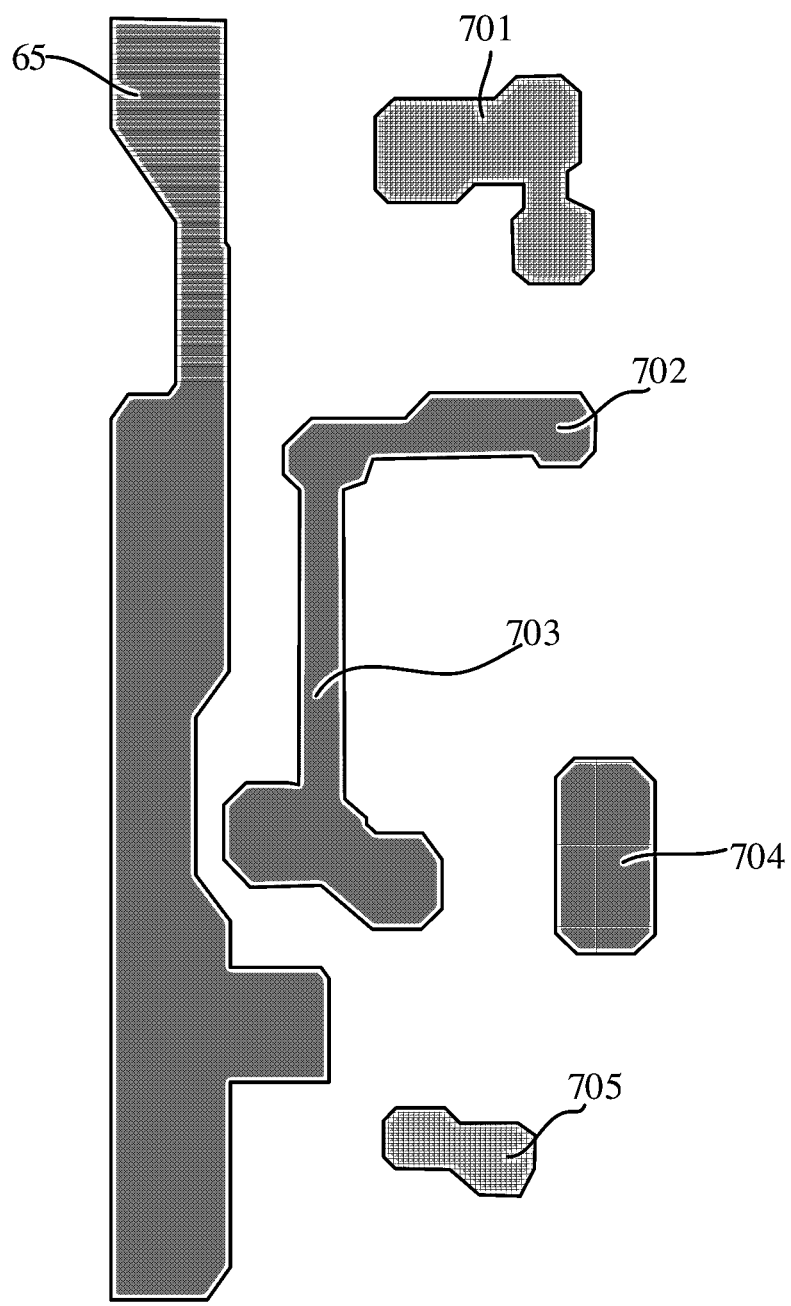
FIG. 11 shows a schematic diagram of a planar structure of a fourth conductive layer of the pixel driving circuit shown in FIG. 5.
Figure 12:
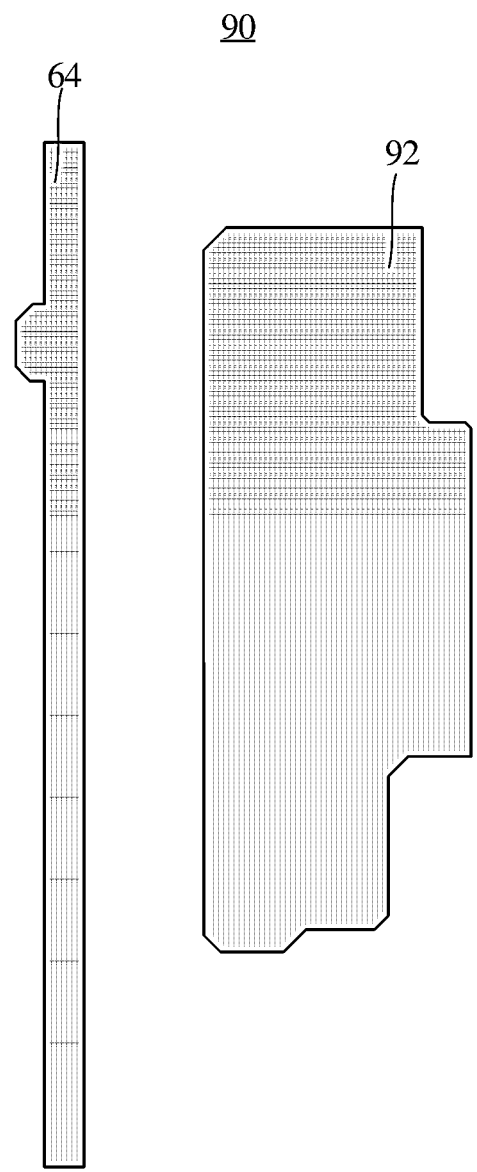
FIG. 12 shows a schematic diagram of a planar structure of a fifth conductive layer of the pixel driving circuit shown in FIG. 5.
Figure 13:
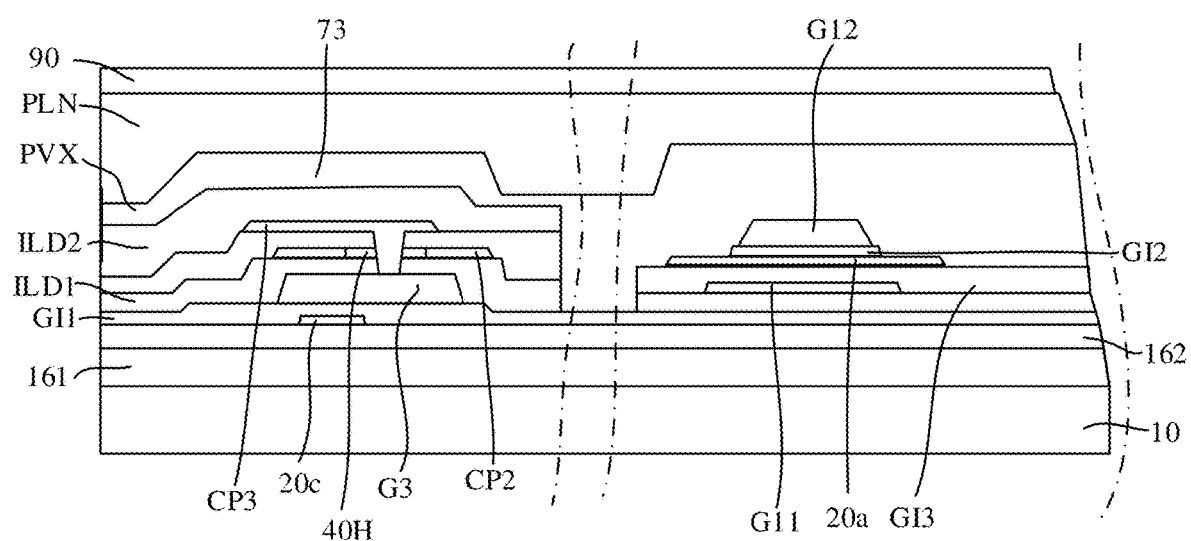
FIG. 13 shows a schematic diagram of cross-sectional structures of the display substrate according to some exemplary embodiments of the present disclosure taken along line AA' and line BB' in FIG. 5, where the cross-sectional structures taken along line AA' and line BB' in FIG. 5 are shown in the same schematic diagram for ease of description.

FIG. 5 shows a schematic diagram of a planar structure of a pixel driving circuit of a sub-pixel of a display substrate according to some exemplary embodiments of the present disclosure. FIG. 6 shows a schematic diagram of a planar structure of a first semiconductor layer of the pixel driving circuit shown in FIG. 5. FIG. 7 shows a schematic diagram of a planar structure of a first conductive layer of the pixel driving circuit shown in FIG. 5. FIG. 8 shows a schematic diagram of a planar structure of a second conductive layer of the pixel driving circuit shown in FIG. 5. FIG. 9 shows a schematic diagram of a planar structure of a second semiconductor layer of the pixel driving circuit shown in FIG. 5. FIG. 10 shows a schematic diagram of a planar structure of a third conductive layer of the pixel driving circuit shown in FIG. 5. FIG. 11 shows a schematic diagram of a planar structure of a fourth conductive layer of the pixel driving circuit shown in FIG. 5. FIG. 12 shows a schematic diagram of a planar structure of a fifth conductive layer of the pixel driving circuit shown in FIG. 5. FIG. 13 shows a schematic diagram of cross-sectional structures of the display substrate according to some exemplary embodiments of the present disclosure taken along line AA' and line BB' in FIG. 5, where the cross-sectional structures taken along line AA' and line BB' in FIG. 5 are shown in the same schematic diagram for ease of description.

Referring to FIG. 5 to FIG. 13 in combination, the display substrate includes a base substrate 10 and a plurality of film layers arranged on the base substrate 10. In some embodiments, the plurality of film layers shown include at least a first semiconductor layer 20, a first conductive layer 30, a second conductive layer 40, a second semiconductor layer 50, a third conductive layer 60, a fourth conductive layer 70, and a fifth conductive layer 90 that are arranged sequentially away from the base substrate 10.

For example, the first semiconductor layer 20 may be formed of a semiconductor material such as low-temperature polysilicon, and may have a thickness in a range of 400~800 angstroms, for example, 500 angstroms. The second semiconductor layer 50 may be formed of an oxide semiconductor material, for example, a polysilicon oxide semiconductor material such as IGZO, and may have a thickness in a range of 300~600 angstroms, for example, 400 angstroms. The first conductive layer 30 may be formed of a conductive material that forms the gate electrode of the thin film transistor and that may be Mo, for example. The first conductive layer 30 may have a thickness in a range of 2000~3000 angstroms, for example, 2500 angstroms. The second conductive layer 40 may be formed of a conductive material that forms the source electrode and the drain electrode of the thin film transistor and that may contain Ti, Al, etc., for example. The second conductive layer 40 may have a stacked structure formed of Ti/Al/Ti, and have a thickness in a range of 7000~9000 angstroms. For example, in a case where the second conductive layer 40 has the stacked structure formed of Ti/Al/Ti, Ti/Al/Ti layers may have a thickness of about 500 angstroms, 5500 angstroms and 500 angstroms, respectively. The third conductive layer 60 may be formed of a conductive material that forms the gate electrode of the thin film transistor and that may be Mo, for example. The third conductive layer 60 has a thickness in a range of 2000~3000 angstroms, for example, 2500 angstroms. The fourth conductive layer 70 may be formed of a conductive material that forms the source electrode and the drain electrode of the thin film transistor and that may contain Ti, Al, etc., for example. The fourth conductive layer 70 may have a stacked structure formed of Ti/Al/Ti, and have a thickness in a range of 7000~9000 angstroms. For example, in a case where the fourth conductive layer 70 has the stacked structure formed of Ti/Al/Ti, Ti/Al/Ti layers may have a thickness of about 500 angstroms, 5500 angstroms and 300 angstroms, respectively. The fifth conductive layer 90 may be formed of a conductive material that forms the source electrode and the drain electrode of the thin film transistor and that may contain Ti, Al, etc., for example. The fourth conductive layer 70 may have a stacked structure formed of Ti/Al/Ti.

The display substrate includes a scan signal line 61, a reset signal line 62, a light emission control line 63 and an initialization voltage line 66 arranged in the row direction so as to respectively apply a scan signal Sn, a reset control signal RESET, a light emission control signal En and an initialization voltage Vint to the sub-pixel. The display substrate may further include a data line 64 and a driving voltage line 65 that cross the scan signal line 61, the reset signal line 62, the light emission control line 63 and the initialization voltage line 66 so as to respectively apply a data signal Dm and a driving voltage VDD to the sub-pixel.

In conjunction with the above description of FIG. 4, the pixel driving circuit of the display substrate may include a first transistor T1, a second transistor T2, a third transistor T3, a fourth transistor T4, a fifth transistor T5, a sixth transistor T6, a seventh transistor T7, and a storage capacitor Cst.

The first transistor T1 and the second transistor T2 may be formed along the second semiconductor layer as shown in FIG. 9. The third transistor T3, the fourth transistor T4, the fifth transistor T5, the sixth transistor T6 and the seventh transistor T7 may be formed along the first semiconductor layer 20 as shown in FIG. 6.

As shown in FIG. 6, the first semiconductor layer 20 may have a curved or bent shape, and may include a third active layer 20c corresponding to the third transistor T3, a fourth active layer 20d corresponding to the fourth transistor T4, a fifth active layer 20e corresponding to the fifth transistor T5, a sixth active layer 20f corresponding to the sixth transistor T6, and a seventh active layer 20g corresponding to the seventh transistor T7.

For example, the first semiconductor layer 20 may contain polysilicon, such as a low temperature polysilicon material. Each active layer of the transistor may include a channel region, a source region and a drain region. The channel region may be non-doped or have a doping type different from that of the source region and the drain region, and therefore has semiconductor characteristics. The source region and the drain region are respectively located on both sides of the channel region, and are doped with impurities, and therefore have conductivity. The impurities may vary depending on whether the TFT is an N-type or P-type transistor.

The third transistor T3 includes the third active layer 20c and a third gate electrode G3. The third active layer 20c includes a third source region 203c, a third drain region 205c, and a third channel region 201c connecting the third source region 203c and the third drain region 205c. The third source region 203c and the third drain region 205c extend in two opposite directions with respect to the third channel region 201c.

The fourth transistor T4 includes the fourth active layer 20d and a fourth gate electrode G4. The fourth active layer 20d includes a fourth source region 203d, a fourth drain region 205d, and a fourth channel region 201d connecting the fourth source region 203d and the fourth drain region 205d. The fourth source region 203d and the fourth drain region 205d extend in two opposite directions with respect to the fourth channel region 201d.

The fifth transistor T5 includes the fifth active layer 20e and a fifth gate electrode G5. The fifth active layer 20e includes a fifth source region 203e, a fifth drain region 205e, and a fifth channel region 201e connecting the fifth source region 203e and the fifth drain region 205e. The fifth source region 203e and the fifth drain region 205e extend in two opposite directions with respect to the fifth channel region 201e.

The sixth transistor T6 includes the sixth active layer 20f and a sixth gate electrode G6. The sixth active layer 20f includes a sixth source region 203f, a sixth drain region 205f, and a sixth channel region 201f connecting the sixth source region 203f and the sixth drain region 205f. The sixth source region 203f and the sixth drain region 205f extend in two opposite directions with respect to the sixth channel region 201f.

The seventh transistor T7 includes the seventh active layer 20g and a seventh gate electrode G7. The seventh active layer 20g includes a seventh source region 203g, a seventh drain region 205g, and a seventh channel region 201g connecting the seventh source region 203g and the seventh drain region 205g. The seventh source region 203g and the seventh drain region 205g extend in two opposite directions with respect to the seventh channel region 201g.

As shown in FIG. 7, the scan signal line 61, the reset signal line 62 and the light emission control line 63 are all located in the first conductive layer 30. A gate structure CG1 is also located in the first conductive layer 30. A portion of the gate structure CG1 that overlaps the first semiconductor layer 20 forms the third gate electrode G3 of the third transistor T3. A portion of the scan signal line 61 that overlaps the first semiconductor layer 20 forms the fourth gate electrode G4 of the fourth transistor T4. A portion of the light emission control line 63 that overlaps the first semiconductor layer 20 forms the fifth gate electrode G5 of the fifth transistor T5. Another portion of the light emission control line 63 that overlaps the first semiconductor layer 20 forms the sixth gate electrode G6 of the sixth transistor T6. A portion of the reset signal line 62 that overlaps the first semiconductor layer 20 forms the seventh gate electrode G7 of the seventh transistor T7. The gate structure CG1 also forms a portion of the capacitor structure, such as a portion of a capacitor electrode (for example, the first capacitor electrode Cst1) of the storage capacitor Cst. That is, the gate structure CG1 simultaneously serves as the gate electrode of the third transistor T3 and one electrode of the storage capacitor Cst.

As shown in FIG. 8, the second conductive layer 40 includes a first bottom gate structure BG1, a second bottom gate structure BG2, and a second capacitor structure CP2. The initialization voltage line 66 is also located in the second conductive layer 40.

Continuing to refer to FIG. 8, the second conductive layer 40 includes a through hole 40H formed in the second capacitor structure CP2.

As shown in FIG. 9, the second semiconductor layer 50 includes a first active layer 20a corresponding to the first transistor T1 and a second active layer 20b corresponding to the second transistor T2. For example, the first active layer 20a of the first transistor T1 and the second active layer 20b of the second transistor T2 extend in the same direction as the data line, that is, both extend in an up-down direction shown.

For example, the second semiconductor layer 50 may contain an oxide semiconductor material, such as a low temperature polysilicon oxide (LTPO) semiconductor material. Each active layer of the transistor may include a channel region, a source region and a drain region. The channel region may be non-doped or have a doping type different from that of the source region and the drain region, and therefore has semiconductor characteristics. The source region and the drain region are respectively located on both sides of the channel region, and are doped with impurities, and therefore have conductivity. The impurities may vary depending on whether the TFT is an N-type or P-type transistor.

The first active layer 20a of the first transistor T1 includes a first source region 203a, a first drain region 205a, and a first channel region 201a connecting the first source region 203a and the first drain region 205a. The first source region 203a and the first drain region 205a extend in two opposite directions with respect to the first channel region 201a.

The second active layer 20b of the second transistor T2 includes a second source region 203b, a second drain region 205b, and a second channel region 201b connecting the second source region 203b and the second drain region 205b. The second source region 203b and the second drain region 205b extend in two opposite directions with respect to the second channel region 201b.

Referring to FIG. 5, FIG. 8 and FIG. 9 in combination, an orthographic projection of the first active layer 20a on the base substrate 10 at least partially overlaps an orthographic projection of the first bottom gate structure BG1 on the base substrate 10, and a portion of the first bottom gate structure BG1 that overlaps the first active layer 20a forms a first bottom gate electrode G11 of the first transistor T1.

An orthographic projection of the second active layer 20b on the base substrate 10 at least partially overlaps an orthographic projection of the second bottom gate structure BG2 on the base substrate 10, and a portion of the second bottom gate structure BG2 that overlaps the second active layer 20b forms a second bottom gate electrode G21 of the second transistor T2.

For example, continuing to refer to FIG. 8 and FIG. 9, the first bottom gate structure BG1 includes a first bottom gate body portion BG11 and a first bottom gate extension portion BG12. An orthographic projection of the first bottom gate body portion BG11 on the base substrate 10 is rectangular. The orthographic projection of the first bottom gate body portion BG11 on the base substrate 10 at least partially overlaps the orthographic projection of the active layer of the first transistor T1 on the base substrate 10, and the first bottom gate electrode G11 includes a portion of the first bottom gate body portion BG11 that overlaps the active layer of the first transistor T1.

The second bottom gate structure BG2 includes a second bottom gate body portion BG21 and a second bottom gate extension portion BG22. An orthographic projection of the second bottom gate body portion BG21 on the base substrate 10 is rectangular. The orthographic projection of the second bottom gate body portion BG21 on the base substrate 10 at least partially overlaps the orthographic projection of the active layer of the second transistor T2 on the base substrate 10, and the second bottom gate electrode G21 includes a portion of the second bottom gate body portion BG21 that overlaps the active layer of the second transistor T2.

In the embodiments shown, the first bottom gate extension portion BG12 and the second bottom gate extension portion BG22 extend in a row direction, that is, in a left-right direction shown. That is, an extension direction of the first bottom gate extension portion BG12 and the second bottom gate extension portion BG22 is substantially parallel to an extension direction of the initialization voltage line 66.

Referring to FIG. 9, the second semiconductor layer 50 further includes a third capacitor structure CP3. The third capacitor structure CP3 includes a portion of the second semiconductor layer 50 that is conductized. For example, after the second semiconductor layer 50 such as IGZO is formed, it may be H-doped by using $SiH_4$ in a film-forming gas so as to reduce a resistivity thereof, thereby forming a portion of the second semiconductor layer 50 that is conductized so as to form the third capacitor structure CP3.

Referring to FIG. 5, FIG. 7, FIG. 8, FIG. 9 and FIG. 13 in combination, the first capacitor structure CG1, the second capacitor structure CP2 and the third capacitor structure CP3 are spaced apart from one another and arranged opposite to one another. An orthographic projection of the first capacitor structure CG1 on the base substrate 10, an orthographic projection of the second capacitor structure CP2 on the base substrate 10 and an orthographic projection of the third capacitor structure CP3 on the base substrate 10 at least partially overlap one another. The first capacitor structure CG1 is electrically connected to the third capacitor structure CP3 through a conductive plug formed in the through hole 40H. In this way, the first capacitor structure CG1 and the third capacitor structure CP3 that are electrically connected to each other form the first capacitor electrode Cst1 of the storage capacitor. The second capacitor structure CP2 is located between the first capacitor structure CG1 and the third capacitor structure CP3, and forms the second capacitor electrode Cst2 of the storage capacitor. Referring to FIG. 4 in combination, the first capacitor electrode Cst1 may be electrically connected to the node N1, and the second capacitor electrode Cst2 may be electrically connected to VDD, so that a storage capacitor may be formed between the first capacitor electrode Cst1 and the second capacitor electrode Cst2. In this way, capacitors may be formed between the first capacitor structure CG1 and the second capacitor structure CP2 and between the second capacitor structure CP2 and the third capacitor structure CP3, respectively. A sum of capacitance values of the two capacitors is equal to a capacitance value of the storage capacitor. That is to say, in this way, it is beneficial to increase the capacitance value of the storage capacitor, so that a performance of the pixel driving circuit is improved.

As shown in FIG. 10, the third conductive layer 60 includes a first top gate structure TG1 and a second top gate structure TG2.

The orthographic projection of the first active layer 20a on the base substrate 10 at least partially overlaps an orthographic projection of the first top gate structure TG1 on the base substrate 10, and the orthographic projection of the first bottom gate structure BG1 on the base substrate 10 at least partially overlaps the orthographic projection of the first top gate structure TG1 on the base substrate 10. A portion of the first top gate structure TG1 that overlaps the first active layer 20a forms a first top gate electrode G12 of the first transistor T1. Referring to FIG. 13 in combination, in a direction perpendicular to an upper surface of the base substrate 10 (that is, in a vertical direction shown in FIG. 13), the first active layer 20a is located between the first bottom gate electrode G11 and the first top gate electrode G12. In this way, the first transistor T1 has a dual-gate structure.

Continuing to refer to FIG. 10, the first top gate structure TG1 extends in a horizontal direction shown in FIG. 10. The first top gate structure TG1 may include a first widened portion TG11, and a size of the first widened portion TG11 in the vertical direction is larger than that of a remaining portion of the first top gate structure TG1 in the vertical direction. An orthographic projection of the first widened portion TG11 on the base substrate 10 at least partially overlaps the orthographic projection of the active layer 20a of the first transistor T1 on the base substrate 10, and the first top gate electrode G12 includes a portion of the first widened portion TG11 that overlaps the active layer 20a of the first transistor T1.

The orthographic projection of the second active layer 20b on the base substrate 10 at least partially overlaps an orthographic projection of the second top gate structure TG2 on the base substrate 10, and the orthographic projection of the second bottom gate structure BG2 on the base substrate 10 at least partially overlaps the orthographic projection of the second top gate structure TG2 on the base substrate 10. A portion of the second top gate structure TG2 that overlaps the second active layer 20b forms a second top gate electrode G22 of the second transistor. Referring to FIG. 13 in combination, in a direction perpendicular to the upper surface of the base substrate 10 (that is, in the vertical direction shown in FIG. 13), the second active layer 20b is located between the second bottom gate electrode G21 and the second top gate electrode G22. In this way, the second transistor T2 has a dual-gate structure.

Continuing to refer to FIG. 10, the second top gate structure TG2 extends in the horizontal direction shown in FIG. 10. The second top gate structure TG2 may include a second widened portion TG21, and a size of the second widened portion TG21 in the vertical direction is larger than that of a remaining portion of the second top gate structure TG2 in the vertical direction. An orthographic projection of the second widened portion TG21 on the base substrate 10 at least partially overlaps the orthographic projection of the active layer 20b of the second transistor T2 on the base substrate, and the second top gate electrode G22 includes a portion of the second widened portion TG21 that overlaps the active layer 20b of the second transistor T2.

As shown in FIG. 11, the fourth conductive layer 70 includes a driving voltage line 65, a first conductive component 701, a second conductive component 702, a third conductive component 703, a fourth conductive component 704 and a fifth conductive component 705.

The driving voltage line 65 is electrically connected to the source region 203e of the fifth transistor T5 through a via hole VAH12. A portion of the driving voltage line 65 that overlaps the source region 203e of the fifth transistor T5 forms the source electrode of the fifth transistor T5.

The first conductive component 701 has one end electrically connected to the source region 203a of the first transistor T1 through the via hole VAH2, and the other end electrically connected to the first conductive member 401 through the via hole VAH4. A portion of the first conductive component 701 is further electrically connected to the initialization voltage line 66 through the via hole VAH3. In this way, the source electrode of the first transistor T1 and the drain electrode of the seventh transistor T7 are electrically connected to each other, and both are electrically connected to the initialization voltage line 66. In this way, the initialization voltage Vint may be applied to the source electrode of the first transistor T1 and the drain electrode of the seventh transistor T7.

The second conductive component 702 has one end electrically connected to the drain region 205b of the second transistor T2 through the via hole VAH7, and the other end electrically connected to the drain region 203a of the first transistor T1 and the third conductive component 703 through the via hole VAH6. The third conductive component 703 has one end electrically connected to the second conductive component 702 through the via hole VAH6, and the other end electrically connected to the gate electrode G1 of the third transistor T3 and the first capacitor electrode Cst1 through the via hole VAH8. That is, the node N1 in FIG. 4 is formed. In this way, the drain electrode of the first transistor T1, the drain electrode of the second transistor T2, the gate electrode of the third transistor T3 and the first capacitor electrode Cst1 may be electrically connected to one another, and referring to FIG. 4, they are all electrically connected to the node N1.

The fourth conductive component 704 has one end electrically connected to the source region 203b of the second transistor T2 through the via hole VAH9, and the other end electrically connected to the source region 203b of the sixth transistor T6 through the via hole VAH10. In this way, the source electrode of the second transistor T2 may be electrically connected to the source electrode of the sixth transistor T6, and referring to FIG. 4, they are both electrically connected to the node N3.

The fifth conductive member 705 has one end electrically connected to the drain region 205f of the sixth transistor T6 and the source region 203g of the seventh transistor T7 through the via hole VAH13, and the other end electrically connected to the first electrode (such as the anode electrode, which will be described below) of the light emitting device through the via hole VAH14. In this way, the drain electrode of the sixth transistor T6, the source electrode of the seventh transistor T7 and the first electrode of the light emitting device may be electrically connected to one another, and referring to FIG. 4, they are all electrically connected to the node N4.

As shown in FIG. 12, the fifth conductive layer 90 includes a data line 64 and a light-shielding layer 902.

The data line 64 is electrically connected to the source region 203d of the fourth transistor T4 through a via hole VAH1 so as to apply the data signal Dm to the source electrode of the fourth transistor T4. That is, a portion of the data line 64 that overlaps the source region 203d of the fourth transistor T4 forms the source electrode of the fourth transistor T4.

An orthographic projection of the light-shielding layer 902 on the base substrate 10 covers the orthographic projection of the first transistor T1 on the base substrate 10 and the orthographic projection of the second transistor T2 on the base substrate 10. For example, the orthographic projection of the light-shielding layer 902 on the base substrate 10 covers the orthographic projection of the active layer 20a of the first transistor T1 on the base substrate 10 and the orthographic projection of the active layer 20b of the second transistor T2 on the base substrate 10. With a design of the light-shielding layer 902, the active layer 20a of the first transistor T1 and the active layer 20b of the second transistor T2 may be protected from external light, which is beneficial to maintaining a stable performance of the first transistor and the second transistor.

For example, the light-shielding layer 902 may be electrically connected to a fixed voltage so as to prevent a potential of the light-shielding layer 902 from floating, thereby preventing the light-shielding layer from adversely affecting the performance of the transistor. For example, the light-shielding layer 902 may be electrically connected to the second capacitor electrode Cst2, that is, electrically connected to the VDD voltage, through the via hole VAH15.

In the embodiments of the present disclosure, the active layers of the first transistor T1 and the second transistor T2 are both formed of an oxide semiconductor material such as LTPO, which may improve a voltage stability at the node N1 in the pixel driving circuit (as shown in FIG. 4), so that the display performance of the display panel is improved. In addition, both the first transistor T1 and the second transistor T2 have a dual-gate structure, which improves the stability of the first transistor T1 and the second transistor T2 as well as the uniformity of the threshold voltage (Vth), so that the performance of the display panel is further improved.

It should also be noted that in the embodiments of the present disclosure, the bottom gate electrodes G11, G21 of the transistors T1, T2 not only function as bottom gate electrodes, but also as a light-shielding layer, which may avoid external light interference to the active layers 20a, 20b of the transistors T1, T2, so that the performance of the transistor is further improved.

Figure 14:
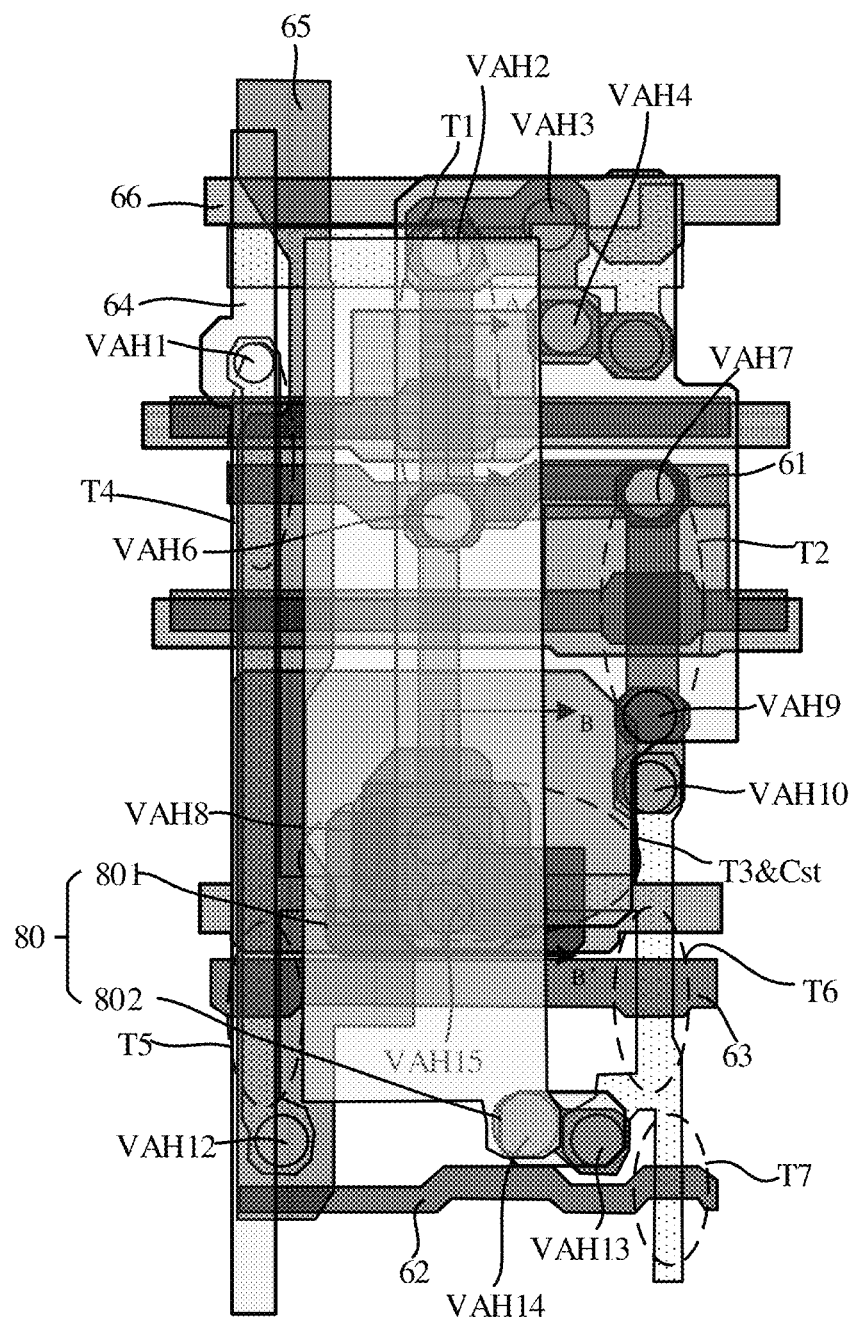
FIG. 14 shows a schematic diagram of a planar structure of a display substrate according to some exemplary embodiments of the present disclosure, where a planar structure of a first electrode of a light emitting device is schematically shown.
Figure 15:
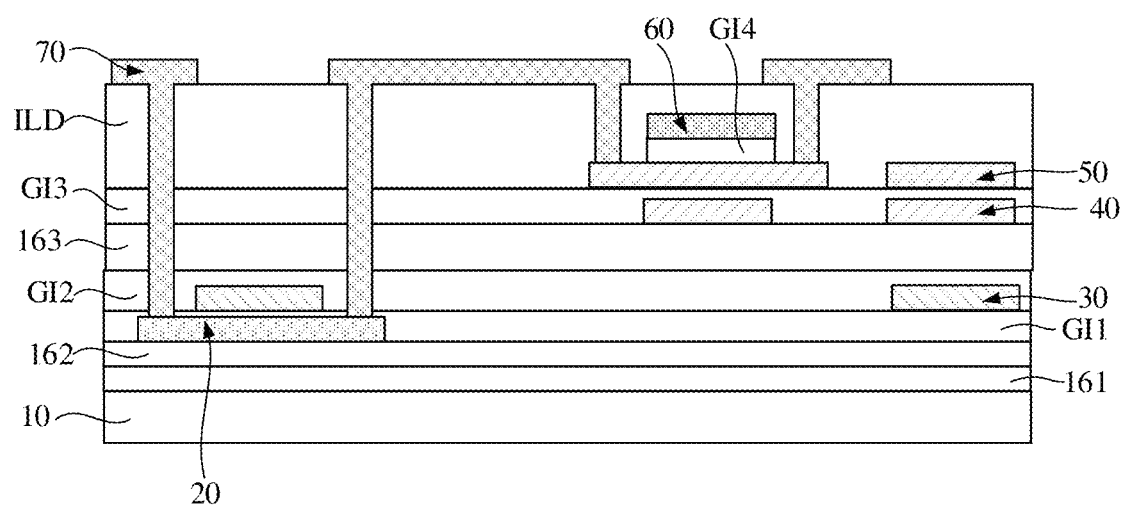
FIG. 15 shows a schematic diagram of a cross-sectional structure of a display substrate according to some exemplary embodiments of the present disclosure.

FIG. 14 shows a schematic diagram of a planar structure of a display substrate according to some exemplary embodiments of the present disclosure, where a planar structure of a first electrode of a light emitting device is schematically shown. FIG. 15 shows a schematic diagram of a cross-sectional structure of a display substrate according to some exemplary embodiments of the present disclosure.

For example, the light emitting device may be an organic light emitting diode, which may include a first electrode, an organic light emitting layer and a second electrode arranged on the base substrate 10. The first electrode may be one of the anode and the cathode, and the second electrode may be the other of the anode and the cathode. The first electrode, the organic light emitting layer and the second electrode may be arranged sequentially away from the base substrate 10.

As shown in FIG. 14, the first electrode 80 may include an electrode body portion 801 and an electrode connecting portion 802. In the embodiments shown in FIG. 14, the electrode body portion 801 may have a substantially rectangular shape. That is, an orthographic projection of the electrode body portion 801 on the base substrate 10 is substantially rectangular. However, the embodiments of the present disclosure are not limited thereto. The electrode body portion 801 may have any suitable shape, for example, a hexagonal shape, an octagonal shape, and the like.

The electrode body portion 801 and the electrode connecting portion 802 may be connected as a whole. The electrode connecting portion 802 is electrically connected to one end of the third conductive member 705 through the via hole VAH14. As described above, the other end of the fifth conductive member 705 is electrically connected to the drain electrode of the sixth transistor T6 and the source electrode of the seventh transistor T7 through the via hole VAH13. In this way, the first electrode 80 is electrically connected to the drain electrode of the sixth transistor T6 and the source electrode of the seventh transistor T7.

For example, the orthographic projection of the first electrode 80 on the base substrate 10 at least covers the orthographic projection of the active layer 20a of the first transistor T1 on the base substrate 10. The orthographic projection of the first electrode 80 on the base substrate 10 is spaced from the orthographic projection of the active layer 20b of the second transistor T2 on the base substrate 10.

Hereinafter, other film layers (for example, the insulating layer) of the display substrate according to the embodiments of the present disclosure will be described with reference to FIG. 13 and FIG. 15.

In the exemplary embodiments, the display substrate may include a barrier layer 161 arranged on the base substrate 10, and a first buffer layer 162 arranged on a side of the barrier layer 161 away from the base substrate 10.

For example, the barrier layer 161 may be formed of silicon oxide and have a thickness of about 5500 angstroms. The first buffer layer 162 may be formed of silicon nitride and have a thickness of about 1000 angstroms. Alternatively, the first buffer layer 162 may include a stacked layer of silicon nitride and silicon oxide. For example, the first buffer layer 162 may include a first buffer sub-layer arranged on the barrier layer 161 and a second buffer sub-layer arranged on a side of the first buffer sub-layer away from the base substrate 10. The first buffer sub-layer contains a silicon nitride material, and the second buffer sub-layer contains a silicon oxide material.

The display substrate may include a first gate insulating layer GI1 arranged between the first semiconductor layer 20 and the first conductive layer 30. For example, the first gate insulating layer GI1 may be formed of silicon oxide.

The display substrate may include a second gate insulating layer GI2 arranged between the first conductive layer 30 and the second conductive layer 40. For example, the second gate insulating layer GI2 may be formed of silicon nitride. In this way, the second gate insulating layer GI2 formed of silicon nitride may supplement hydrogen (H) to the first transistor so as to improve the performance of the first transistor.

The display substrate may include a second buffer layer 163 arranged between the second gate insulating layer GI2 and the second conductive layer 40. For example, the second buffer layer 163 may be formed of silicon nitride or silicon oxide.

The display substrate may include a third gate insulating layer GI3 arranged between the second conductive layer 40 and the second semiconductor layer 50. For example, the third gate insulating layer GI3 may be formed of silicon oxide. In this way, the third gate insulating layer GI3 formed of silicon oxide may block a penetration of hydrogen (H) into the oxide semiconductor transistors (T1, T2), so as to improve the performance of the oxide semiconductor transistors (T1, T2).

The display substrate may include a fourth gate insulating layer GI4 arranged between the second semiconductor layer 50 and the third conductive layer 60. For example, the fourth gate insulating layer GI4 may be formed of silicon oxide. In this way, the fourth gate insulating layer GI4 formed of silicon oxide may block the penetration of hydrogen (H) into the oxide semiconductor transistors (T1, T2), so as to improve the performance of the oxide semiconductor transistors (T1, T2).

In the embodiments of the present disclosure, a distance between the surface of the first active layer 20a close to the base substrate 10 (for example, a lower surface of the first active layer 20a in FIG. 13) and a surface of the first bottom gate electrode G11 away from the base substrate 10 (for example, an upper surface of the first bottom gate electrode G11 in FIG. 13) is greater than a distance between a surface of the first active layer 20a away from the base substrate 10 (for example, an upper surface of the first active layer 20a in FIG. 13) and a surface of the first top gate electrode G12 close to the base substrate 10 (for example, a lower surface of the first top gate electrode G12 in FIG. 13).

For example, the distance between the surface of the first active layer 20a close to the base substrate 10 (for example, the lower surface of the first active layer 20a in FIG. 13) and the surface of the first bottom gate electrode G11 away from the base substrate 10 (for example, the upper surface of the first bottom gate electrode G11 in FIG. 13) may be in a range of 3000~6000 angstroms, such as 3500 angstroms, 4000 angstroms or 4500 angstroms. The distance between the surface of the first active layer 20a away from the base substrate 10 (for example, the upper surface of the first active layer 20a in FIG. 13) and the surface of the first top gate electrode G12 close to the base substrate 10 (for example, the lower surface of the first top gate electrode G12 in FIG. 13) may be in a range of 1000~2000 angstroms, such as 1300 angstroms or 1500 angstroms.

In the embodiments of the present disclosure, the distance between the surface of the first active layer 20a close to the base substrate 10 (for example, the lower surface of the first active layer 20a in FIG. 13) and the surface of the first bottom gate electrode G11 away from the base substrate 10 (for example, the upper surface of the first bottom gate electrode G11 in FIG. 13) is greater than a distance between a surface of the third active layer 20c away from the base substrate 10 and a surface of the third gate electrode G3 close to the base substrate 10.

For example, the distance between the surface of the third active layer 20a away from the base substrate 10 and the surface of the third gate electrode G3 close to the base substrate 10 may be in a range of 1000~2000 angstroms, such as 1300 angstroms or 1500 angstroms.

In the embodiments of the present disclosure, the distance between the surface of the first active layer 20a away from the base substrate 10 (for example, the upper surface of the first active layer 20a in FIG. 13) and the surface of the first top gate electrode G12 close to the base substrate 10 (for example, the lower surface of the first top gate electrode G12 in FIG. 13) is substantially equal to the distance between the surface of the third active layer 20c away from the base substrate 10 and the surface of the third gate electrode G3 close to the base substrate 10.

The display substrate may include an interlayer insulating layer ILD arranged between the third conductive layer 60 and the fourth conductive layer 70 as well as between the second semiconductor layer 50 and the fourth conductive layer 70. For example, the interlayer insulating layer ILD may be formed of a single layer of silicon oxide, or may be formed of a stacked structure made of silicon oxide and silicon nitride. For example, the interlayer insulating layer ILD may include a first interlayer insulating sub-layer formed of silicon oxide and a second interlayer insulating sub-layer formed of silicon nitride. The first interlayer insulating sub-layer is closer to the base substrate 10 than the second interlayer insulating sub-layer.

In the embodiments of the present disclosure, in a transistor having a dual-gate structure, for example, in the first transistor T1, only the third gate insulating layer GI3 is provided between the bottom gate electrode G11 and the active layer 20a, and no other insulating layers are provided. In this way, the distance between the bottom gate electrode G11 and the active layer 20a is reduced, which is conducive to a formation of a good dual-gate drive in the first transistor and is conducive to providing the driving capability of the transistor, so that a carrier mobility and an electric reliability of the transistor are improved. It should be understood that the second transistor T2 has the same structure and effect.

Figure 16:
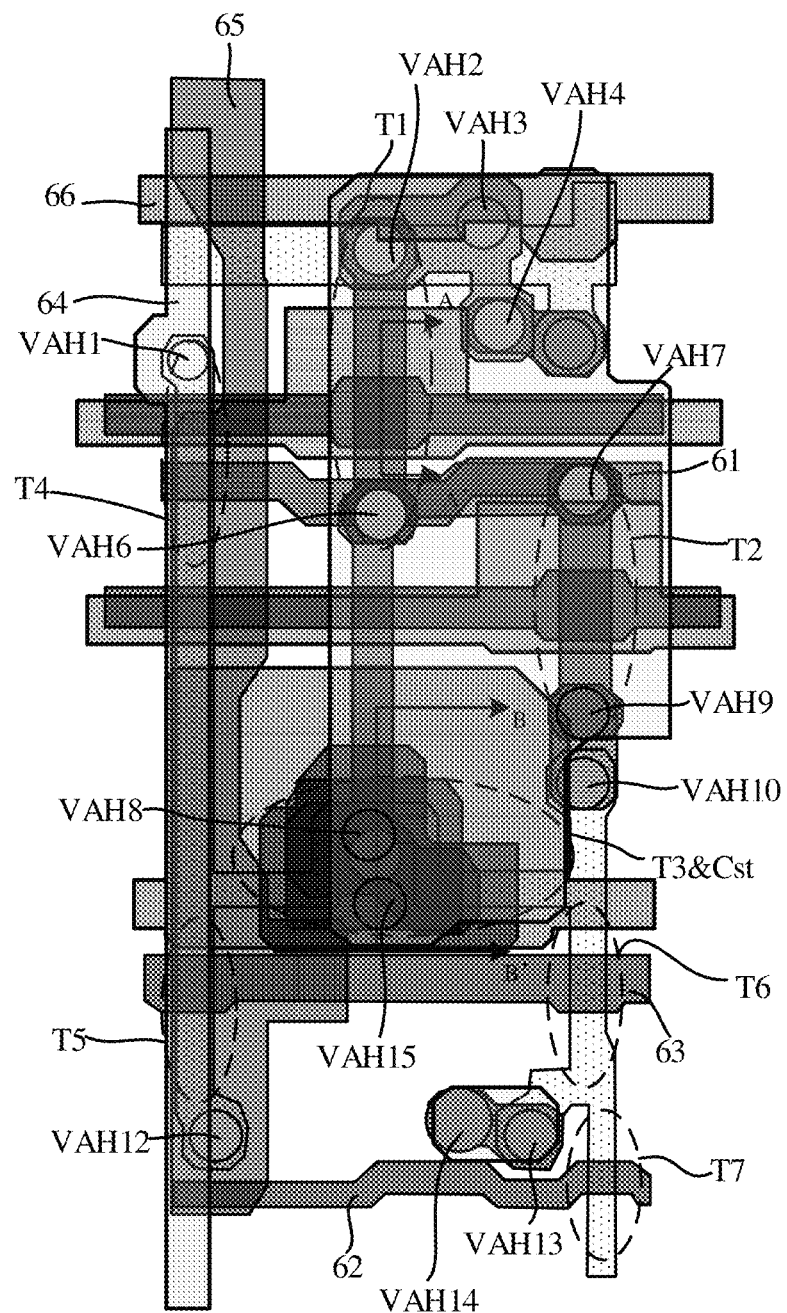
FIG. 16 shows a schematic diagram of a planar structure of a pixel driving circuit of a sub-pixel of a display substrate according to other exemplary embodiments of the present disclosure.
Figure 17:
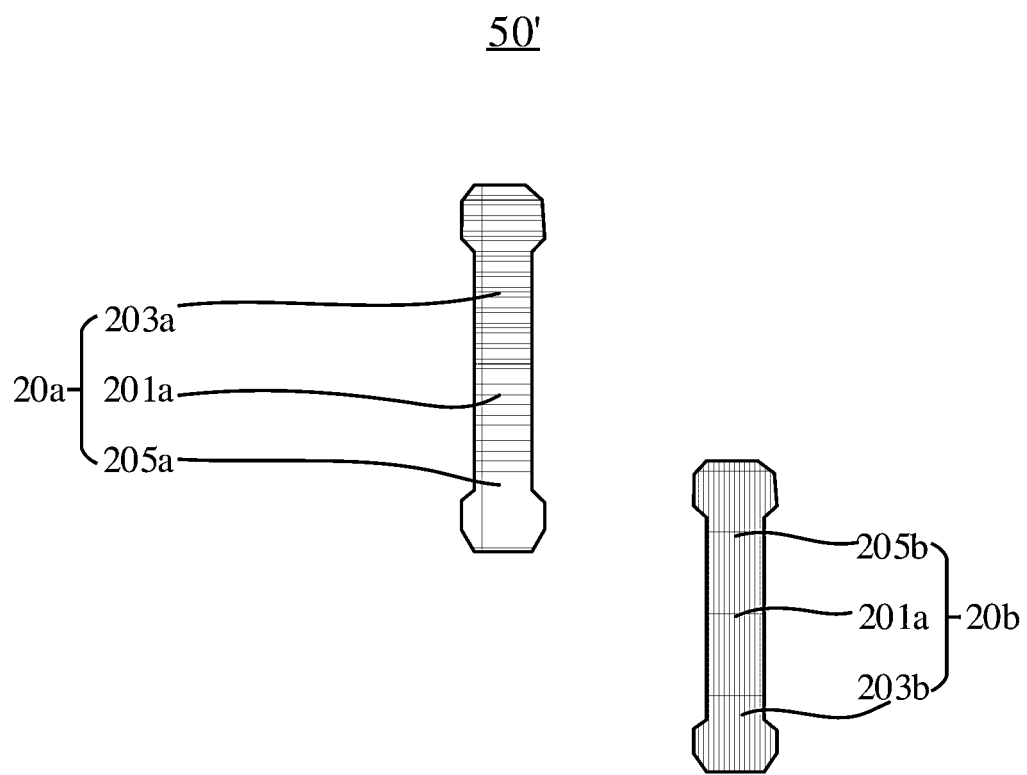
FIG. 17 shows a schematic diagram of a planar structure of a second semiconductor layer of the pixel driving circuit shown in FIG. 16.
Figure 18:
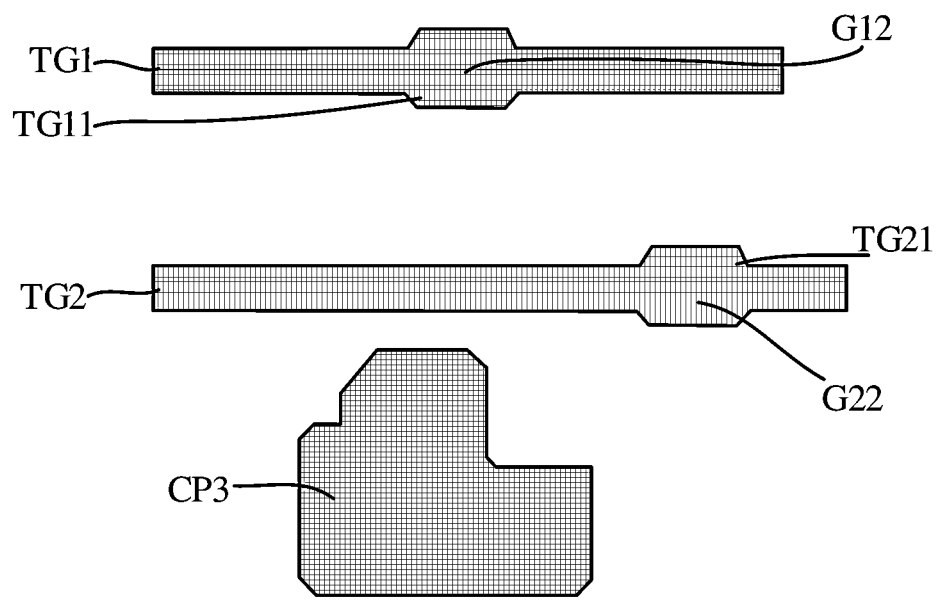
FIG. 18 shows a schematic diagram of a planar structure of a third conductive layer of the pixel driving circuit shown in FIG. 16.

FIG. 16 shows a schematic diagram of a planar structure of a pixel driving circuit of a sub-pixel of a display substrate according to other exemplary embodiments of the present disclosure. FIG. 17 shows a schematic diagram of a planar structure of a second semiconductor layer of the pixel driving circuit shown in FIG. 16. FIG. 18 shows a schematic diagram of a planar structure of a third conductive layer of the pixel driving circuit shown in FIG. 16.

It should be noted that the difference between the display substrate in the embodiments shown in FIG. 16 and the display substrate in the embodiments described above is mainly described below, and other structures may refer to the structure of the display substrate in the embodiments described above.

Similarly, as shown in FIG. 16, the display substrate includes a base substrate 10 and a plurality of film layers arranged on the base substrate 10. In some embodiments, the plurality of film layers shown include at least a first semiconductor layer 20, a first conductive layer 30, a second conductive layer 40, a second semiconductor layer 50, a third conductive layer 60, a fourth conductive layer 70, and a fifth conductive layer 90 that are arranged sequentially away from the base substrate 10. For the first semiconductor layer 20, the first conductive layer 30, the second conductive layer 40, the fourth conductive layer 70 and the fifth conductive layer 90, reference may be made to the above description.

As shown in FIG. 17, a second semiconductor layer 50' includes a first active layer 20a corresponding to the first transistor T1 and a second active layer 20b corresponding to the second transistor T2. For example, the first active layer 20a of the first transistor T1 and the second active layer 20b of the second transistor T2 extend in the same direction as the data line, that is, both extend in an up-down direction shown.

A third conductive layer 60' includes a first top gate structure TG1 and a second top gate structure TG2.

The first active layer 20a, the second active layer 20b, the first top gate structure TG1 and the second top gate structure TG2 may refer to the above description, which will not be repeated here.

In this embodiment, the third capacitor structure CP3 is formed in the third conductive layer 60', instead of formed in the second semiconductor layer 50'. As shown in FIG. 18, the third conductive layer 60' includes a third capacitor structure CP3.

Figure 19:
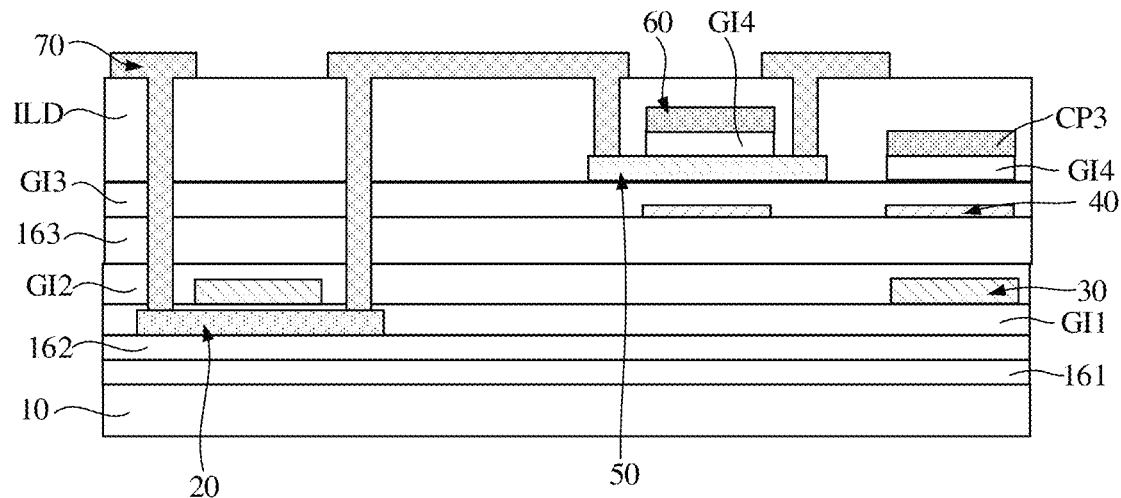
FIG. 19 shows a schematic diagram of a cross-sectional structure of a display substrate according to some exemplary embodiments of the present disclosure.

FIG. 19 shows a schematic diagram of a cross-sectional structure of a display substrate according to some exemplary embodiments of the present disclosure. Referring to FIG. 16 to FIG. 19, the first capacitor structure CG1, the second capacitor structure CP2 and the third capacitor structure CP3 are spaced apart from one another and arranged opposite to one another. An orthographic projection of the first capacitor structure CG1 on the base substrate 10, an orthographic projection of the second capacitor structure CP2 on the base substrate 10 and an orthographic projection of the third capacitor structure CP3 on the base substrate 10 at least partially overlap one another. The first capacitor structure CG1 is electrically connected to the third capacitor structure CP3 through a conductive plug formed in the through hole 40H. In this way, the first capacitor structure CG1 and the third capacitor structure CP3 that are electrically connected to each other form the first capacitor electrode Cst1 of the storage capacitor. The second capacitor structure CP2 is located between the first capacitor structure CG1 and the third capacitor structure CP3, and forms the second capacitor electrode Cst2 of the storage capacitor. Referring to FIG. 4 in combination, the first capacitor electrode Cst1 may be electrically connected to the node N1, and the second capacitor electrode Cst2 may be electrically connected to VDD, so that a storage capacitor may be formed between the first capacitor electrode Cst1 and the second capacitor electrode Cst2. In this way, capacitors may be formed between the first capacitor structure CG1 and the second capacitor structure CP2 and between the second capacitor structure CP2 and the third capacitor structure CP3, respectively. A sum of capacitance values of the two capacitors is equal to a capacitance value of the storage capacitor. In the embodiments of the present disclosure, a second gate insulating layer GI2 and a second buffer layer 163 are provided between the first capacitor structure CG1 and the second capacitor structure CP2. A third gate insulating layer GI3 and a fourth gate insulating layer GI4 are provided between the second capacitor structure CP2 and the third capacitor structure CP3. In this way, a storage capacitor having an increased capacitance value is formed. That is to say, in this way, it is beneficial to increase the capacitance value of the storage capacitor, so that a performance of the pixel driving circuit is improved.

Figure 20:
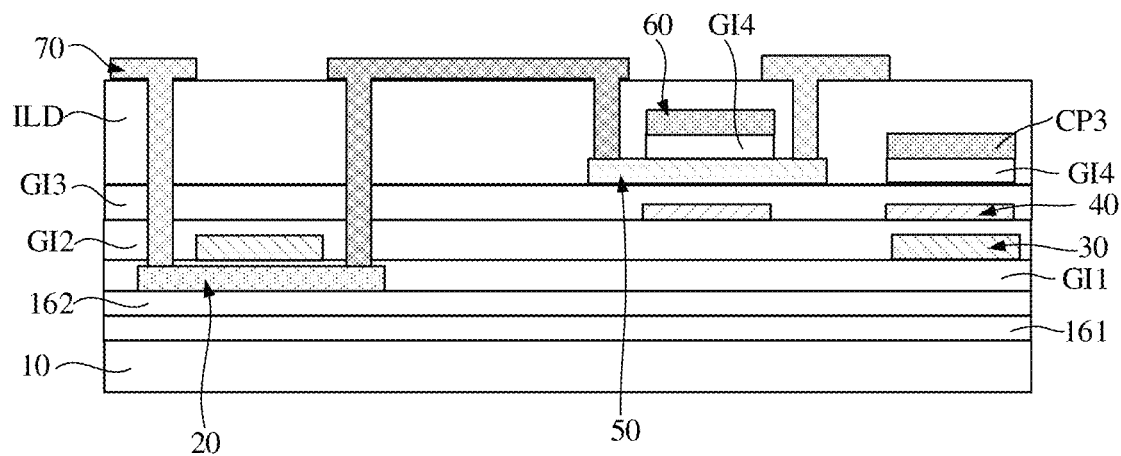
FIG. 20 shows a schematic diagram of a cross-sectional structure of a display substrate according to some exemplary embodiments of the present disclosure.

FIG. 20 shows a schematic diagram of a cross-sectional structure of a display substrate according to some exemplary embodiments of the present disclosure. In the embodiments shown in FIG. 20, the second buffer layer 163 is removed. A third gate insulating layer GI3 is provided between the bottom gate electrode (such as G11 or G21) of the transistor and the active layer (20a or 20b). The third gate insulating layer GI3 contains a silicon oxide material, which may block a penetration of hydrogen (H) into a channel region of the transistor.

Referring to FIG. 20, only the second gate insulating layer GI2 is provided between the first capacitor structure CG1 and the second capacitor structure CP2. In this way, a distance between the first capacitor structure CG1 and the second capacitor structure CP2 is reduced. Therefore, the capacitance value of the capacitor formed between the first capacitor structure CG1 and the second capacitor structure CP2 is increased, so that an overall capacitance value of the storage capacitor may be increased.

Figure 21:
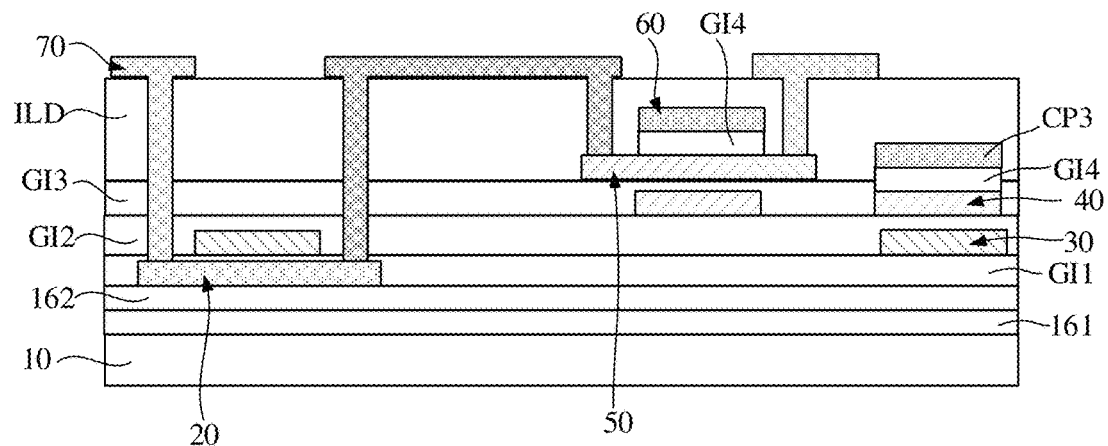
FIG. 21 shows a schematic diagram of a cross-sectional structure of a display substrate according to some exemplary embodiments of the present disclosure.

FIG. 21 shows a schematic diagram of a cross-sectional structure of a display substrate according to some exemplary embodiments of the present disclosure. In the embodiments shown in FIG. 21, a portion of the third gate insulating layer GI3 between the second capacitor structure CP2 and the third capacitor structure CP3 is removed, that is, only the fourth gate insulating layer GI4 is provided between the second capacitor structure CP2 and the third capacitor structure CP3. In this way, a distance between the second capacitor structure CP2 and the third capacitor structure CP3 is reduced. Therefore, the capacitance value of the capacitor formed between the second capacitor structure CP2 and the third capacitor structure CP3 is increased, so that the overall capacitance value of the storage capacitor may be increased.

Figure 22:
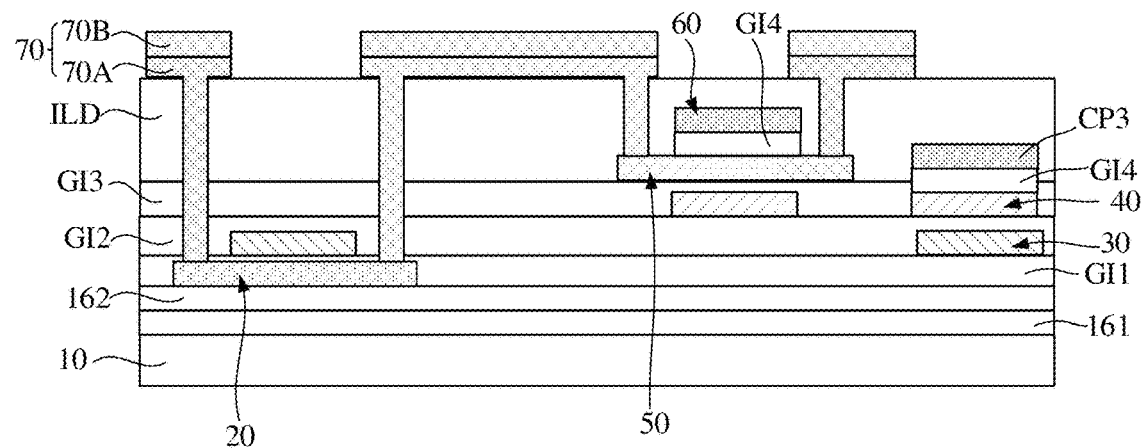
FIG. 22 shows a schematic diagram of a cross-sectional structure of a display substrate according to some exemplary embodiments of the present disclosure.

FIG. 22 shows a schematic diagram of a cross-sectional structure of a display substrate according to some exemplary embodiments of the present disclosure. In the embodiments shown in FIG. 22, the fourth conductive layer 70 may have a stacked structure. For example, the fourth conductive layer 70 may include a first conductive sub-layer 70A and a second conductive sub-layer 70B. The first conductive sub-layer 70A is arranged on the interlayer insulating layer ILD, and the second conductive sub-layer 70B is arranged on a side of the first conductive sub-layer 70A away from the base substrate 10. The first conductive sub-layer 70A and the second conductive sub-layer 70A are in contact with each other.

For example, the first conductive sub-layer 70A may contain Mo, Ti, Al, etc. The second conductive sub-layer 70B may be formed of a conductive material that forms the source electrode and the drain electrode of the thin film transistor and that may contain Ti, Al, etc.

Figure 23:
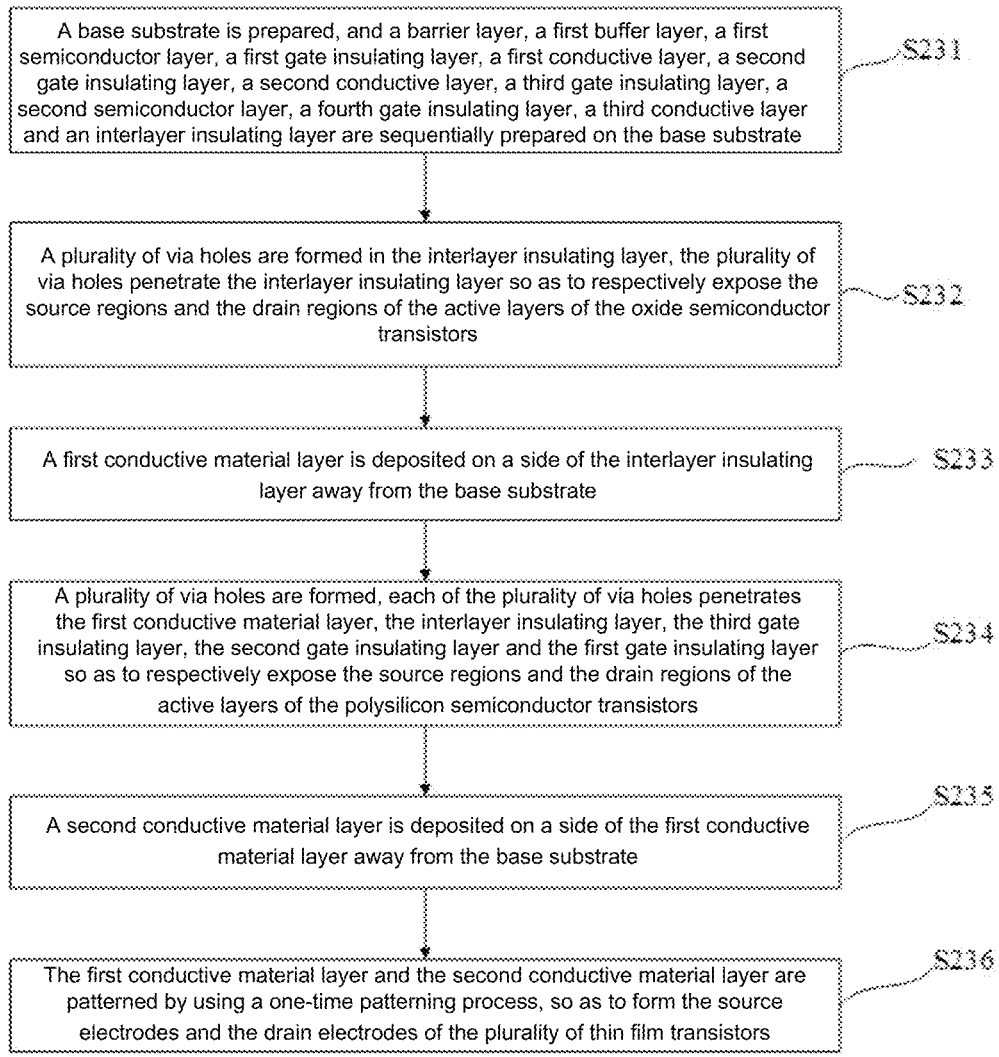
FIG. 23 shows a flowchart of a manufacturing method of a display substrate according to some exemplary embodiments of the present disclosure.

FIG. 23 shows a flowchart of a manufacturing method of a display substrate according to some exemplary embodiments of the present disclosure. FIG. 24 to FIG. 28 show schematic diagrams of cross-sectional structures of a display substrate formed after some steps in the manufacturing method shown in FIG. 23 are performed. Referring to FIG. 22 to FIG. 28 in combination, the method of manufacturing the display panel may be performed according to following steps.

Figure 24:
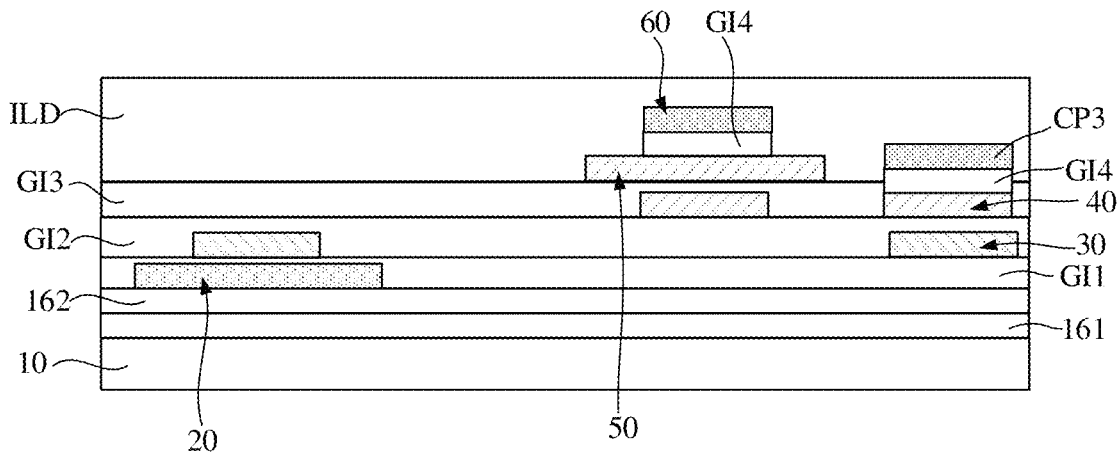
FIG. 24 to FIG. 28 show schematic diagrams of cross-sectional structures of a display substrate formed after some steps in the manufacturing method shown in FIG. 23 are performed.

Referring to FIG. 24, in step S231, a base substrate 10 is prepared. For example, the base substrate 10 may be an organic flexible substrate formed of, for example, polyimide (PI), polyethylene terephthalate (PET), polycarbonate, polyethylene, polyacrylate, polyetherimide, polyethersulfone, etc. The base substrate 10 may have a single-layer structure or a double-layer structure. For example, the base substrate 10 may include a first substrate, a second substrate, and a first barrier layer arranged between the first substrate and the second substrate. The base substrate 10 has a thickness of about 5~20 microns.

Then, a barrier layer 161, a first buffer layer 162, a first semiconductor layer 20, a first gate insulating layer GI1, a first conductive layer 30, a second gate insulating layer GI2, a second conductive layer 40, a third gate insulating layer GI3, a second semiconductor layer 50, a fourth gate insulating layer GI4, a third conductive layer 60 and an interlayer insulating layer IDL are sequentially prepared on the base substrate 10.

Figure 25:
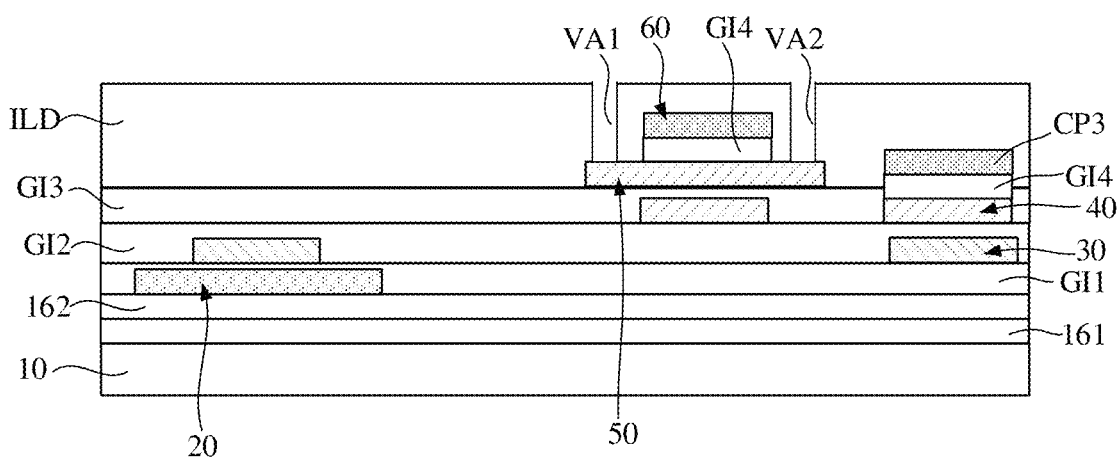

Referring to FIG. 25, in step S232, a plurality of via holes VA1, VA2 are formed in the interlayer insulating layer IDL. The plurality of via holes VA1, VA2 penetrate the interlayer insulating layer IDL so as to respectively expose the source regions and the drain regions of the active layers of the oxide semiconductor transistors (that is, the first transistor and the second transistor described above).

Figure 26:
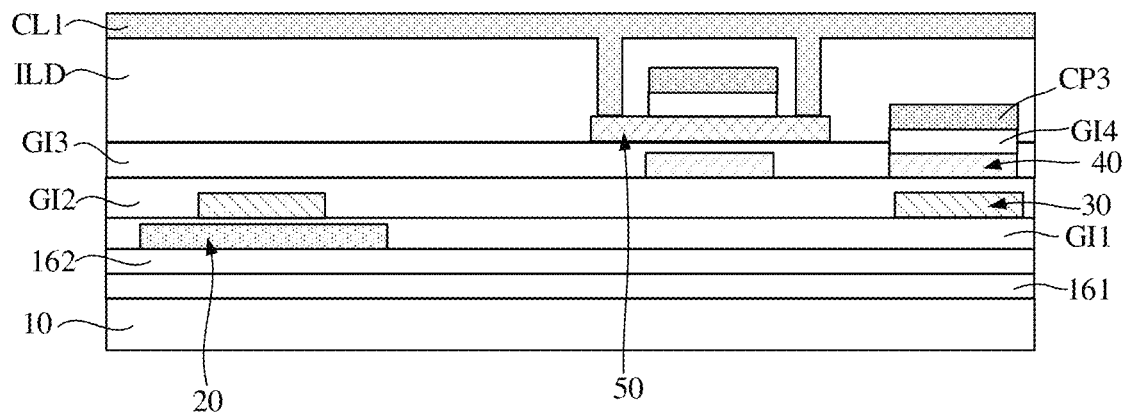

Referring to FIG. 26, in step S233, a first conductive material layer CL1 is deposited on a side of the interlayer insulating layer IDL away from the base substrate 10. For example, the first conductive material layer CL1 may contain Mo. The first conductive material layer CL1 may be filled in the plurality of via holes VA1, VA2 so as to contact the source region and the drain region of the active layer of the first transistor or the second transistor.

Figure 27:
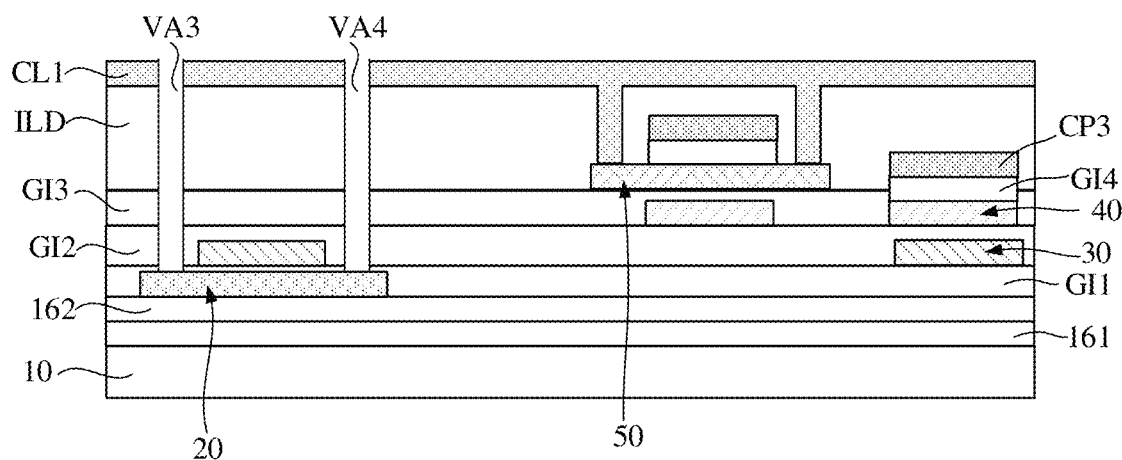

Referring to FIG. 27, in step S234, a plurality of via holes VA3, VA4 are formed. Each of the plurality of via holes VA3, VA4 penetrates the first conductive material layer CL1, the interlayer insulating layer IDL, the third gate insulating layer GI3, the second gate insulating layer GI2 and the first gate insulating layer GI1 so as to respectively expose the source regions and the drain regions of the active layers of the polysilicon semiconductor transistors (that is, the third transistor to the seventh transistor described above).

In this step, the plurality of via holes VA3 and VA4 are formed by a dry etching process, and then need to be cleaned by using an etching solution. Under the protection of the first conductive material layer CL1, the etching solution may not damage the interlayer insulating layer IDL and the active layers (that is, the active layers 20a and 20b) of the oxide semiconductor transistors.

Figure 28:
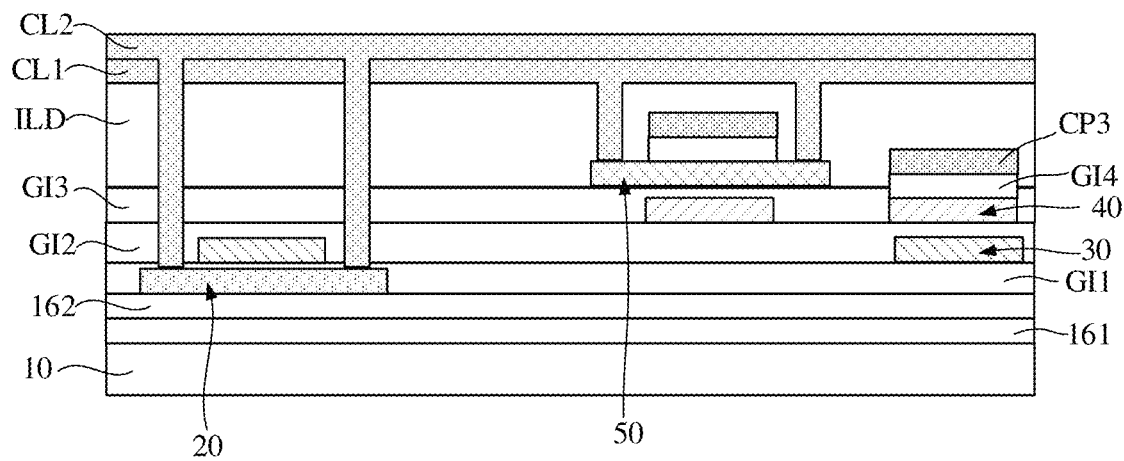

Referring to FIG. 28, in step S235, a second conductive material layer CL2 is deposited on a side of the first conductive material layer CL1 away from the base substrate 10. For example, the second conductive material layer CL2 may contain Ti, Al, etc. The second conductive material layer CL2 may be stacked on the first conductive material layer CL1 and filled in the plurality of via holes VA3, VA4 so as to contact the source region and the drain region of the active layer of the polysilicon semiconductor transistor.

Referring to FIG. 22, in step S236, the first conductive material layer CL1 and the second conductive material layer CL2 are patterned by using one patterning process, so as to form the source electrodes and the drain electrodes of the plurality of thin film transistors. In this way, the number of patterning processes is reduced, and the masks are saved.

Referring to FIG. 1, at least some embodiments of the present disclosure further provide a display device. The display device may include the display substrate as described above.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

It should be understood that the display panel and the display device according to the embodiments of the present disclosure have all the features and advantages of the display substrate described above. The details may refer to the above description and will not be repeated here.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:
    a base substrate;
    a first transistor on the base substrate;
    a first semiconductor layer on the base substrate;
    a second semiconductor layer on a side of the first semiconductor layer away from the base substrate; and
    a third transistor,
    wherein the first transistor comprises a first active layer, a first bottom gate electrode between the base substrate and the first active layer, and a first top gate electrode on a side of the first active layer away from the base substrate, and any two of an orthographic projection of the active layer on the base substrate, an orthographic projection of the first bottom gate electrode on the base substrate and an orthographic projection of the first top gate electrode on the base substrate at least partially overlaps one another; and
    wherein a third gate insulating layer is provided between the first bottom gate electrode and the first active layer, the first active layer contains an oxide semiconductor material, the third gate insulating layer contains a silicon oxide material, a surface of the first bottom gate electrode away from the base substrate is in direct contact with the silicon oxide material, and a surface of the first active layer close to the base substrate is in direct contact with the silicon oxide material; and
    wherein the third transistor comprises a third active layer and a third gate electrode, the third active layer is located in the first semiconductor layer and contains a polysilicon semiconductor material, and the first active layer is located in the second semiconductor layer.

2. The display substrate of claim 1, wherein a distance between a surface of the first active layer close to the base substrate and a surface of the first bottom gate electrode away from the base substrate is greater than that between a surface of the first active layer away from the base substrate and a surface of the first top gate electrode close to the base substrate.

3. The display substrate of claim 1, wherein a distance between a surface of the first active layer close to the base substrate and a surface of the first bottom gate electrode away from the base substrate is greater than that between a surface of the third active layer away from the base substrate and a surface of the third gate electrode close to the base substrate.

4. The display substrate of claim 1, wherein a distance between a surface of the first active layer away from the base substrate and a surface of the first top gate electrode close to the base substrate is substantially equal to that between a surface of the third active layer away from the base substrate and a surface of the third gate electrode close to the base substrate.

5. The display substrate of claim 1, further comprising a second transistor, wherein the second transistor comprises a second bottom gate electrode between the base substrate and the active layer of the second transistor, and a second top gate electrode on a side of the active layer of the second transistor away from the base substrate; and wherein any two of an orthographic projection of the active layer of the second transistor on the base substrate, an orthographic projection of the second bottom gate electrode on the base substrate and an orthographic projection of the second top gate electrode on the base substrate at least partially overlaps one another.

6. The display substrate of claim 5, further comprising a storage capacitor, wherein the storage capacitor comprises a first capacitor structure, a second capacitor structure and a third capacitor structure on the base substrate; the third capacitor structure is located on a side of the first capacitor structure away from the base substrate, the second capacitor structure is located between the first capacitor structure and the third capacitor structure, and any two of an orthographic projection of the first capacitor structure on the base substrate, an orthographic projection of the second capacitor structure on the base substrate and an orthographic projection of the third capacitor structure on the base substrate at least partially overlaps one another; and
wherein the first capacitor structure and the third capacitor structure are electrically connected to each other so as to form a first capacitor electrode of the storage capacitor, and the second capacitor structure forms a second capacitor electrode of the storage capacitor.

7. The display substrate of claim 6, further comprising a first conductive layer on the base substrate, wherein the first conductive layer is located on a side of the first semiconductor layer away from the base substrate; and
wherein the first capacitor structure and the third gate electrode of the third transistor are located in the first conductive layer.

8. The display substrate of claim 7, further comprising a second conductive layer on the base substrate, wherein the second conductive layer is located between the first conductive layer and the second semiconductor layer; and
wherein the first bottom gate electrode and the second capacitor structure are located in the second conductive layer.

9. The display substrate of claim 8, further comprising a third conductive layer on the base substrate, wherein the third conductive layer is located on a side of the second semiconductor layer away from the base substrate; and
wherein the first top gate electrode and the third capacitor structure are located in the third conductive layer.

10. The display substrate of claim 9, further comprising a first buffer layer between the base substrate and the first semiconductor layer, wherein the first buffer layer contains silicon oxide, silicon nitride or silicon oxynitride.

11. The display substrate of claim 10, further comprising:
a first gate insulating layer between the first semiconductor layer and the first conductive layer, wherein the first gate insulating layer contains silicon oxide; and/or
a second gate insulating layer between the first conductive layer and the second conductive layer, wherein the second gate insulating layer contains silicon nitride; and/or
a fourth gate insulating layer between the second semiconductor layer and the third conductive layer, wherein the fourth gate insulating layer contains silicon oxide.

12. The display substrate of claim 10, further comprising:
a second gate insulating layer between the first conductive layer and the second conductive layer, wherein the second gate insulating layer contains silicon nitride; and
a second buffer layer between the second gate insulating layer and the second conductive layer, wherein two insulating layers are provided between the first capacitor structure and the second capacitor structure, and the two insulating layers comprise a portion of the second gate insulating layer and a portion of the second buffer layer.

13. The display substrate of claim 9, further comprising a fourth conductive layer on a side of the third conductive layer away from the base substrate, wherein each of the plurality of thin film transistors comprises a source electrode and a drain electrode, and the source electrode and the drain electrode of each thin film transistor are located in the fourth conductive layer.

14. The display substrate of claim 13, further comprising a fifth conductive layer on a side of the fourth conductive layer away from the base substrate, wherein the fifth conductive layer comprises a light-shielding layer, and an orthographic projection of the light-shielding layer on the base substrate at least covers each of the orthographic projection of the active layer of the first transistor on the base substrate and the orthographic projection of active layer of the second transistor on the base substrate.

15. The display substrate of claim 13, wherein the fourth conductive layer comprises a first conductive sub-layer arranged on the interlayer insulating layer and a second conductive sub-layer arranged on a side of the first conductive sub-layer away from the base substrate, and the first conductive sub-layer and the second conductive sub-layer are in contact with each other.

16. A display panel comprising the display substrate of claim 1.

17. A display device comprising the display substrate of claim 1.

18. A method of manufacturing a display substrate, comprising:
providing a base substrate;
forming a first transistor on the base substrate;
preparing a first semiconductor layer on the base substrate by using a patterning process, wherein the first semiconductor layer contains a polysilicon semiconductor island;
forming a first conductive layer on a side of the first semiconductor layer away from the base substrate by using a patterning process;
forming a second conductive layer on a side of the first conductive layer away from the base substrate by using a patterning process;
forming an insulating layer on a side of the second conductive layer away from the base substrate; and
forming a second semiconductor layer on a side of the second conductive layer away from the base substrate by using a patterning process, wherein the second semiconductor layer contains an oxide semiconductor island,
wherein the display substrate comprises a plurality of thin film transistors on the base substrate, the plurality of thin film transistors at least comprise a first transistor, a second transistor and a third transistor;
wherein each of the plurality of thin film transistors comprises an active layer, the active layer of the third transistor is located in the first semiconductor layer, and at least one of the active layer of the first transistor or the active layer of the second transistor is located in the second semiconductor layer; and
wherein the first transistor comprises a first active layer, a first bottom gate electrode between the base substrate and the first active layer, and a first top gate electrode on a side of the first active layer away from the base substrate, and any two of an orthographic projection of the first active layer on the base substrate, and an orthographic projection of the first bottom gate electrode on the base substrate and an orthographic projection of the first top gate electrode on the base substrate at least partially overlaps one another; and wherein a third gate insulating layer is provided between the first bottom gate electrode and the first active layer, the first active layer contains the oxide semiconductor island, the third gate insulating layer contains a silicon oxide material, a surface of the first-top bottom gate electrode away from the base substrate is in direct contact with the silicon oxide material, and a surface of the first active layer close to the base substrate is in direct contact with the silicon oxide material.

19. The method of claim 18, further comprising:

forming an interlayer insulating layer on a side of the first top gate electrode away from the base substrate;

forming a plurality of first via holes in the interlayer insulating layer, wherein the plurality of first via holes expose at least a portion of the active layer of the first transistor and at least a portion of the active layer of the second transistor;

depositing a first conductive material layer on a side of the interlayer insulating layer away from the base substrate;

forming a plurality of second via holes, wherein the plurality of second via holes expose at least a portion of the active layer of the third transistor;

depositing a second conductive layer on a side of the first conductive material layer away from the base substrate; and patterning the first conductive material layer and the second conductive material layer by using one patterning process, so as to form source electrodes and drain electrodes of the plurality of thin film transistors.

\* \* \* \* \*